(12) United States Patent
Xie et al.

(10) Patent No.: US 9,842,956 B2
(45) Date of Patent: Dec. 12, 2017

(54) SYSTEM AND METHOD FOR MASS-PRODUCTION OF HIGH-EFFICIENCY PHOTOVOLTAIC STRUCTURES

(71) Applicant: SolarCity Corporation, San Mateo, CA (US)

(72) Inventors: Zhigang Xie, San Jose, CA (US); Anand J. Reddy, Castro Valley, CA (US); Chunguang Xiao, Fremont, CA (US); Jiunn Benjamin Heng, Los Altos Hills, CA (US)

(73) Assignee: Tesla, Inc., Palo Alto, CA (US)

( * ) Notice: Subject to any disclaimer, the term of this patent is extended or adjusted under 35 U.S.C. 154(b) by 0 days.

(21) Appl. No.: 14/976,900

(22) Filed: Dec. 21, 2015

(65) Prior Publication Data

US 2017/0179326 A1 Jun. 22, 2017

(51) Int. Cl.
*H01L 31/07* (2012.01)
*H01L 31/0725* (2012.01)
*H01L 31/18* (2006.01)

(52) U.S. Cl.
CPC ...... *H01L 31/0725* (2013.01); *H01L 31/1804* (2013.01); *H01L 31/1868* (2013.01); *H01L 31/1884* (2013.01)

(58) Field of Classification Search
CPC ............................ H01L 31/0236; H01L 31/202
See application file for complete search history.

(56) References Cited

U.S. PATENT DOCUMENTS

| | | |
|---|---|---|
| 819,360 A | 3/1902 | Mayer |
| 2,626,907 A | 1/1953 | De |
| 2,938,938 A | 5/1960 | Dickson |
| 3,094,439 A | 6/1963 | Mann |
| 3,116,171 A | 12/1963 | Nielsen |
| 3,459,597 A | 8/1969 | Baron |
| 3,961,997 A | 6/1976 | Chu |
| 3,969,163 A | 7/1976 | Wakefield |
| 4,015,280 A | 3/1977 | Matsushita |

(Continued)

FOREIGN PATENT DOCUMENTS

| | | |
|---|---|---|
| CN | 1253381 | 5/2000 |
| CN | 1416179 | 10/2001 |

(Continued)

OTHER PUBLICATIONS

Machine translation of JP 10004204 A, Shindou et al.

(Continued)

*Primary Examiner* — Caridad Everhart
*Assistant Examiner* — Ankush Singal
(74) *Attorney, Agent, or Firm* — Shun Yao; Park, Vaughan, Fleming & Dowler, LLP

(57) ABSTRACT

One embodiment of the invention can provide a system for fabricating a photovoltaic structure. During fabrication, the system can form a sacrificial layer on a first side of a Si substrate; load the Si substrate into a chemical vapor deposition tool, with the sacrificial layer in contact with a wafer carrier; and form a first doped Si layer on a second side of the Si substrate. The system subsequently can remove the sacrificial layer; load the Si substrate into a chemical vapor deposition tool, with the first doped Si layer facing a wafer carrier; and form a second doped Si layer on the first side of the Si substrate.

20 Claims, 9 Drawing Sheets

(56) References Cited

U.S. PATENT DOCUMENTS

| | | |
|---|---|---|
| 4,082,568 A | 4/1978 | Lindmayer |
| 4,124,410 A | 11/1978 | Kotval |
| 4,124,455 A | 11/1978 | Lindmayer |
| 4,193,975 A | 3/1980 | Kotval |
| 4,200,621 A | 4/1980 | Liaw |
| 4,213,798 A | 7/1980 | Williams |
| 4,251,285 A | 2/1981 | Yoldas |
| 4,284,490 A | 8/1981 | Weber |
| 4,315,096 A | 2/1982 | Tyan |
| 4,336,648 A | 6/1982 | Pschunder |
| 4,342,044 A | 7/1982 | Ovshinsky |
| 4,431,858 A | 2/1984 | Gonzalez |
| 4,514,579 A | 4/1985 | Hanak |
| 4,540,843 A | 9/1985 | Gochermann |
| 4,567,642 A | 2/1986 | Dilts |
| 4,571,448 A | 2/1986 | Barnett |
| 4,577,051 A | 3/1986 | Hartman |
| 4,586,988 A | 5/1986 | Nath |
| 4,589,191 A | 5/1986 | Green |
| 4,612,409 A | 9/1986 | Hamakawa |
| 4,617,421 A | 10/1986 | Nath |
| 4,633,033 A | 12/1986 | Nath |
| 4,652,693 A | 3/1987 | Bar-On |
| 4,657,060 A | 4/1987 | Kaucic |
| 4,667,060 A | 5/1987 | Spitzer |
| 4,670,096 A | 6/1987 | Schwirtlich |
| 4,694,115 A | 9/1987 | Lillington |
| 4,753,683 A | 6/1988 | Ellion |
| 4,771,017 A | 9/1988 | Tobin |
| 4,784,702 A | 11/1988 | Henri |
| 4,877,460 A | 10/1989 | Flodl |
| 4,933,061 A | 6/1990 | Kulkarni |
| 4,968,384 A | 11/1990 | Asano |
| 5,053,355 A | 10/1991 | von Campe |
| 5,057,163 A | 10/1991 | Barnett |
| 5,075,763 A | 12/1991 | Spitzer |
| 5,084,107 A | 1/1992 | Deguchi |
| 5,118,361 A | 6/1992 | Fraas |
| 5,131,933 A | 7/1992 | Floedl |
| 5,178,685 A | 1/1993 | Borenstein |
| 5,181,968 A | 1/1993 | Nath |
| 5,213,628 A | 5/1993 | Noguchi |
| 5,217,539 A | 6/1993 | Fraas |
| 5,279,682 A | 1/1994 | Wald |
| 5,286,306 A | 2/1994 | Menezes |
| 5,364,518 A | 11/1994 | Hartig |
| 5,401,331 A | 3/1995 | Ciszek |
| 5,455,430 A | 10/1995 | Noguchi |
| 5,461,002 A | 10/1995 | Safir |
| 5,563,092 A | 10/1996 | Ohmi |
| 5,576,241 A | 11/1996 | Sakai |
| 5,627,081 A | 5/1997 | Tsuo |
| 5,676,766 A | 10/1997 | Probst |
| 5,681,402 A | 10/1997 | Ichinose |
| 5,698,451 A | 12/1997 | Hanoka |
| 5,705,828 A | 1/1998 | Noguchi |
| 5,726,065 A | 3/1998 | Szlufcik |
| 5,808,315 A | 9/1998 | Murakami |
| 5,814,195 A | 9/1998 | Lehan |
| 5,903,382 A | 5/1999 | Tench |
| 5,935,345 A | 8/1999 | Kuznicki |
| 6,034,322 A | 3/2000 | Pollard |
| 6,091,019 A | 7/2000 | Sakata |
| 6,140,570 A | 10/2000 | Kariya |
| 6,232,545 B1 | 5/2001 | Samaras |
| 6,303,853 B1 | 10/2001 | Fraas |
| 6,333,457 B1 | 12/2001 | Mulligan |
| 6,410,843 B1 | 6/2002 | Kishi |
| 6,441,297 B1 | 8/2002 | Keller |
| 6,468,828 B1 | 10/2002 | Glatfelter |
| 6,488,824 B1 | 12/2002 | Hollars |
| 6,538,193 B1 | 3/2003 | Fraas |
| 6,552,414 B1 | 4/2003 | Horzel |
| 6,586,270 B2 | 7/2003 | Tsuzuki |
| 6,620,645 B2 | 9/2003 | Chandra |
| 6,672,018 B2 | 1/2004 | Shingleton |
| 6,683,360 B1 | 1/2004 | Dierickx |
| 6,736,948 B2 | 5/2004 | Barrett |
| 6,803,513 B2 | 10/2004 | Beernink |
| 6,841,051 B2 | 1/2005 | Crowley |
| 7,030,413 B2 | 4/2006 | Nakamura |
| 7,128,975 B2 | 10/2006 | Inomata |
| 7,164,150 B2 | 1/2007 | Terakawa |
| 7,328,534 B2 | 2/2008 | Dinwoodie |
| 7,388,146 B2 | 6/2008 | Fraas |
| 7,399,385 B2 | 7/2008 | German |
| 7,534,632 B2 | 5/2009 | Hu |
| 7,635,810 B2 | 12/2009 | Luch |
| 7,737,357 B2 | 6/2010 | Cousins |
| 7,749,883 B2 | 7/2010 | Meeus |
| 7,769,887 B1 | 8/2010 | Bhattacharyya |
| 7,772,484 B2 | 8/2010 | Li |
| 7,777,128 B2 | 8/2010 | Montello |
| 7,825,329 B2 | 11/2010 | Basol |
| 7,829,781 B2 | 11/2010 | Montello |
| 7,829,785 B2 | 11/2010 | Basol |
| 7,872,192 B1 | 1/2011 | Fraas |
| 7,905,995 B2 | 3/2011 | German |
| 7,977,220 B2 | 7/2011 | Sanjurjo |
| 8,070,925 B2 | 12/2011 | Hoffman |
| 8,115,093 B2 | 2/2012 | Gui |
| 8,152,536 B2 | 4/2012 | Scherer |
| 8,168,880 B2 | 5/2012 | Jacobs |
| 8,182,662 B2 | 5/2012 | Crowley |
| 8,196,360 B2 | 6/2012 | Metten |
| 8,209,920 B2 | 7/2012 | Krause |
| 8,222,513 B2 | 7/2012 | Luch |
| 8,222,516 B2 | 7/2012 | Cousins |
| 8,258,050 B2 | 9/2012 | Cho |
| 8,343,795 B2 | 1/2013 | Luo |
| 8,586,857 B2 | 11/2013 | Everson |
| 8,671,630 B2 | 3/2014 | Lena |
| 8,686,283 B2 | 4/2014 | Heng |
| 8,815,631 B2 | 8/2014 | Cousins |
| 9,029,181 B2 | 5/2015 | Rhodes |
| 9,147,788 B2 | 9/2015 | DeGroot |
| 9,287,431 B2 | 3/2016 | Mascarenhas |
| 2001/0008143 A1 | 7/2001 | Sasaoka |
| 2002/0015881 A1 | 2/2002 | Nakamura |
| 2002/0072207 A1 | 6/2002 | Andoh |
| 2002/0086456 A1 | 7/2002 | Cunningham |
| 2002/0176404 A1 | 11/2002 | Girard |
| 2002/0189939 A1 | 12/2002 | German |
| 2003/0000568 A1 | 1/2003 | Gonsiorawski |
| 2003/0000571 A1 | 1/2003 | Wakuda |
| 2003/0034062 A1 | 2/2003 | Stern |
| 2003/0042516 A1 | 3/2003 | Forbes |
| 2003/0070705 A1 | 4/2003 | Hayden |
| 2003/0097447 A1 | 5/2003 | Johnston |
| 2003/0116185 A1 | 6/2003 | Oswald |
| 2003/0121228 A1 | 7/2003 | Stoehr |
| 2003/0168578 A1 | 9/2003 | Taguchi |
| 2003/0183270 A1 | 10/2003 | Falk |
| 2003/0201007 A1 | 10/2003 | Fraas |
| 2004/0065363 A1 | 4/2004 | Fetzer |
| 2004/0103937 A1 | 6/2004 | Bilyalov |
| 2004/0112426 A1 | 6/2004 | Hagino |
| 2004/0123897 A1 | 7/2004 | Ojima |
| 2004/0135979 A1 | 7/2004 | Hazelton |
| 2004/0152326 A1 | 8/2004 | Inomata |
| 2004/0185683 A1 | 9/2004 | Nakamura |
| 2004/0200520 A1 | 10/2004 | Mulligan |
| 2005/0009319 A1 | 1/2005 | Abe |
| 2005/0012095 A1 | 1/2005 | Niira |
| 2005/0022861 A1 | 2/2005 | Rose |
| 2005/0061665 A1 | 3/2005 | Pavani |
| 2005/0064247 A1 | 3/2005 | Sane |
| 2005/0074954 A1 | 4/2005 | Yamanaka |
| 2005/0109388 A1 | 5/2005 | Murakami |
| 2005/0133084 A1 | 6/2005 | Joge |
| 2005/0178662 A1 | 8/2005 | Wurczinger |
| 2005/0189015 A1 | 9/2005 | Rohatgi |
| 2005/0199279 A1 | 9/2005 | Yoshimine |
| 2005/0252544 A1 | 11/2005 | Rohatgi |

(56) References Cited

U.S. PATENT DOCUMENTS

| | | |
|---|---|---|
| 2005/0257823 A1 | 11/2005 | Zwanenburg |
| 2006/0012000 A1 | 1/2006 | Estes |
| 2006/0060238 A1 | 3/2006 | Hacke |
| 2006/0060791 A1 | 3/2006 | Hazelton |
| 2006/0130891 A1 | 6/2006 | Carlson |
| 2006/0154389 A1 | 7/2006 | Doan |
| 2006/0213548 A1 | 9/2006 | Bachrach |
| 2006/0231803 A1 | 10/2006 | Wang |
| 2006/0255340 A1 | 11/2006 | Manivannan |
| 2006/0260673 A1 | 11/2006 | Takeyama |
| 2006/0272698 A1 | 12/2006 | Durvasula |
| 2006/0283496 A1 | 12/2006 | Okamoto |
| 2006/0283499 A1 | 12/2006 | Terakawa |
| 2007/0023081 A1 | 2/2007 | Johnson |
| 2007/0023082 A1 | 2/2007 | Manivannan |
| 2007/0108437 A1 | 5/2007 | Tavkhelidze |
| 2007/0110975 A1 | 5/2007 | Schneweis |
| 2007/0132034 A1 | 6/2007 | Curello |
| 2007/0137699 A1 | 6/2007 | Manivannan |
| 2007/0148336 A1 | 6/2007 | Bachrach |
| 2007/0186968 A1 | 8/2007 | Nakauchi |
| 2007/0186970 A1 | 8/2007 | Takahashi |
| 2007/0202029 A1 | 8/2007 | Burns |
| 2007/0235829 A1 | 10/2007 | Levine |
| 2007/0256728 A1 | 11/2007 | Cousins |
| 2007/0274504 A1 | 11/2007 | Maes |
| 2007/0283996 A1 | 12/2007 | Hachtmann |
| 2007/0283997 A1 | 12/2007 | Hachtmann |
| 2008/0000522 A1 | 1/2008 | Johnson |
| 2008/0041436 A1 | 2/2008 | Lau |
| 2008/0041437 A1 | 2/2008 | Yamaguchi |
| 2008/0047602 A1 | 2/2008 | Krasnov |
| 2008/0047604 A1 | 2/2008 | Korevaar |
| 2008/0053519 A1 | 3/2008 | Pearce |
| 2008/0061293 A1 | 3/2008 | Ribeyron |
| 2008/0092947 A1 | 4/2008 | Lopatin |
| 2008/0121272 A1 | 5/2008 | Besser |
| 2008/0121276 A1 | 5/2008 | Lopatin |
| 2008/0121932 A1 | 5/2008 | Ranade |
| 2008/0128013 A1 | 6/2008 | Lopatin |
| 2008/0149161 A1 | 6/2008 | Nishida |
| 2008/0156370 A1 | 7/2008 | Abdallah |
| 2008/0173347 A1 | 7/2008 | Korevaar |
| 2008/0173350 A1 | 7/2008 | Choi |
| 2008/0196757 A1 | 8/2008 | Yoshimine |
| 2008/0202577 A1 | 8/2008 | Hieslmair |
| 2008/0202582 A1 | 8/2008 | Noda |
| 2008/0216891 A1 | 9/2008 | Harkness |
| 2008/0230122 A1 | 9/2008 | Terakawa |
| 2008/0251114 A1 | 10/2008 | Tanaka |
| 2008/0251117 A1 | 10/2008 | Schubert |
| 2008/0264477 A1 | 10/2008 | Moslehi |
| 2008/0276983 A1 | 11/2008 | Drake |
| 2008/0283115 A1 | 11/2008 | Fukawa |
| 2008/0302030 A1 | 12/2008 | Stancel |
| 2008/0303503 A1 | 12/2008 | Wolfs |
| 2008/0308145 A1 | 12/2008 | Krasnov |
| 2009/0007965 A1 | 1/2009 | Rohatgi |
| 2009/0056805 A1 | 3/2009 | Barnett |
| 2009/0078318 A1 | 3/2009 | Meyers |
| 2009/0084439 A1 | 4/2009 | Lu |
| 2009/0101872 A1 | 4/2009 | Young |
| 2009/0120492 A1* | 5/2009 | Sinha ............... H01L 31/0256 136/255 |
| 2009/0139512 A1 | 6/2009 | Lima |
| 2009/0151783 A1 | 6/2009 | Lu |
| 2009/0155028 A1 | 6/2009 | Boguslavskiy |
| 2009/0160259 A1 | 6/2009 | Naiknaware et al. |
| 2009/0188561 A1 | 7/2009 | Aiken |
| 2009/0221111 A1 | 9/2009 | Frolov |
| 2009/0229854 A1 | 9/2009 | Fredenberg |
| 2009/0239331 A1 | 9/2009 | Xu |
| 2009/0250108 A1 | 10/2009 | Zhou |
| 2009/0255574 A1 | 10/2009 | Yu |
| 2009/0283138 A1 | 11/2009 | Lin |
| 2009/0283145 A1 | 11/2009 | Kim |
| 2009/0293948 A1 | 12/2009 | Tucci |
| 2009/0301549 A1 | 12/2009 | Moslehi |
| 2009/0308439 A1 | 12/2009 | Adibi |
| 2009/0317934 A1 | 12/2009 | Scherff |
| 2009/0320897 A1 | 12/2009 | Shimomura |
| 2010/0006145 A1 | 1/2010 | Lee |
| 2010/0015756 A1* | 1/2010 | Weidman ......... H01L 21/67155 438/96 |
| 2010/0043863 A1 | 2/2010 | Wudu |
| 2010/0065111 A1 | 3/2010 | Fu |
| 2010/0068890 A1 | 3/2010 | Stockum |
| 2010/0084009 A1 | 4/2010 | Carlson |
| 2010/0087031 A1 | 4/2010 | Veschetti |
| 2010/0108134 A1 | 5/2010 | Ravi |
| 2010/0116325 A1 | 5/2010 | Nikoonahad |
| 2010/0124619 A1 | 5/2010 | Xu |
| 2010/0132774 A1 | 6/2010 | Borden |
| 2010/0132792 A1 | 6/2010 | Kim |
| 2010/0147364 A1 | 6/2010 | Gonzalez |
| 2010/0154869 A1 | 6/2010 | Oh |
| 2010/0169478 A1 | 7/2010 | Saha |
| 2010/0175743 A1 | 7/2010 | Gonzalez |
| 2010/0186802 A1* | 7/2010 | Borden ............... H01L 31/0236 136/255 |
| 2010/0193014 A1 | 8/2010 | Johnson |
| 2010/0218799 A1 | 9/2010 | Stefani |
| 2010/0224230 A1 | 9/2010 | Luch |
| 2010/0229914 A1 | 9/2010 | Adriani |
| 2010/0236612 A1 | 9/2010 | Khajehoddin |
| 2010/0240172 A1 | 9/2010 | Rana |
| 2010/0269904 A1 | 10/2010 | Cousins |
| 2010/0279492 A1 | 11/2010 | Yang |
| 2010/0300506 A1 | 12/2010 | Heng |
| 2010/0300507 A1 | 12/2010 | Heng |
| 2010/0313877 A1 | 12/2010 | Bellman |
| 2010/0326518 A1 | 12/2010 | Juso |
| 2011/0005569 A1 | 1/2011 | Sauar |
| 2011/0005920 A1 | 1/2011 | Ivanov |
| 2011/0073175 A1 | 3/2011 | Hilali |
| 2011/0088762 A1 | 4/2011 | Singh |
| 2011/0146759 A1 | 6/2011 | Lee |
| 2011/0146781 A1 | 6/2011 | Laudisio |
| 2011/0156188 A1 | 6/2011 | Tu |
| 2011/0168250 A1 | 7/2011 | Lin |
| 2011/0168261 A1 | 7/2011 | Welser |
| 2011/0174374 A1 | 7/2011 | Harder |
| 2011/0186112 A1 | 8/2011 | Aernouts |
| 2011/0220182 A1 | 9/2011 | Lin |
| 2011/0245957 A1 | 10/2011 | Porthouse |
| 2011/0259419 A1 | 10/2011 | Hagemann |
| 2011/0272012 A1 | 11/2011 | Heng |
| 2011/0277688 A1 | 11/2011 | Trujillo |
| 2011/0277816 A1 | 11/2011 | Xu |
| 2011/0277825 A1 | 11/2011 | Fu et al. |
| 2011/0284064 A1 | 11/2011 | Engelhart |
| 2011/0297224 A1 | 12/2011 | Miyamoto |
| 2011/0297227 A1 | 12/2011 | Pysch |
| 2011/0308573 A1 | 12/2011 | Jaus |
| 2012/0000502 A1 | 1/2012 | Wiedeman |
| 2012/0012174 A1 | 1/2012 | Wu |
| 2012/0028461 A1 | 2/2012 | Ritchie |
| 2012/0031480 A1 | 2/2012 | Tisler |
| 2012/0040487 A1 | 2/2012 | Asthana |
| 2012/0060911 A1 | 3/2012 | Fu |
| 2012/0073975 A1 | 3/2012 | Ganti |
| 2012/0080083 A1 | 4/2012 | Liang |
| 2012/0085384 A1 | 4/2012 | Beitel |
| 2012/0122262 A1 | 5/2012 | Kang |
| 2012/0125391 A1 | 5/2012 | Pinarbasi |
| 2012/0145233 A1 | 6/2012 | Syn |
| 2012/0152349 A1 | 6/2012 | Cao |
| 2012/0152752 A1 | 6/2012 | Keigler |
| 2012/0167986 A1 | 7/2012 | Meakin |
| 2012/0192932 A1 | 8/2012 | Wu |
| 2012/0240995 A1 | 9/2012 | Coakley |
| 2012/0248497 A1 | 10/2012 | Zhou |
| 2012/0279443 A1 | 11/2012 | Kornmeyer |
| 2012/0279548 A1 | 11/2012 | Munch |

(56) References Cited

U.S. PATENT DOCUMENTS

| | | |
|---|---|---|
| 2012/0285517 A1 | 11/2012 | Souza |
| 2012/0305060 A1 | 12/2012 | Fu |
| 2012/0318319 A1 | 12/2012 | Pinarbasi |
| 2012/0318340 A1* | 12/2012 | Heng .............. H01L 31/0745 136/255 |
| 2012/0319253 A1 | 12/2012 | Mizuno |
| 2012/0325282 A1 | 12/2012 | Snow |
| 2013/0000705 A1 | 1/2013 | Shappir |
| 2013/0014802 A1 | 1/2013 | Zimmerman |
| 2013/0056051 A1 | 3/2013 | Jin |
| 2013/0096710 A1 | 4/2013 | Pinarbasi |
| 2013/0112239 A1 | 5/2013 | Liptac |
| 2013/0130430 A1 | 5/2013 | Moslehi |
| 2013/0139878 A1 | 6/2013 | Bhatnagar |
| 2013/0152996 A1 | 6/2013 | DeGroot |
| 2013/0160826 A1 | 6/2013 | Beckerman |
| 2013/0174897 A1* | 7/2013 | You .............. H01L 31/02242 136/255 |
| 2013/0206213 A1 | 8/2013 | He |
| 2013/0206221 A1 | 8/2013 | Gannon |
| 2013/0213469 A1 | 8/2013 | Kramer |
| 2013/0220401 A1 | 8/2013 | Scheulov |
| 2013/0228221 A1 | 9/2013 | Moslehi |
| 2013/0247955 A1 | 9/2013 | Baba |
| 2013/0269771 A1 | 10/2013 | Cheun |
| 2013/0291743 A1 | 11/2013 | Endo |
| 2014/0000682 A1 | 1/2014 | Zhao |
| 2014/0053899 A1 | 2/2014 | Haag |
| 2014/0066265 A1 | 3/2014 | Oliver |
| 2014/0102524 A1* | 4/2014 | Xie .............. H01L 31/03520 136/255 |
| 2014/0124013 A1 | 5/2014 | Morad |
| 2014/0124014 A1 | 5/2014 | Morad |
| 2014/0154836 A1 | 6/2014 | Kim |
| 2014/0196768 A1 | 7/2014 | Heng |
| 2014/0242746 A1 | 8/2014 | Albadri |
| 2014/0318611 A1 | 10/2014 | Moslehi |
| 2014/0345674 A1 | 11/2014 | Yang |
| 2014/0349441 A1 | 11/2014 | Fu |
| 2015/0007879 A1 | 1/2015 | Kwon |
| 2015/0020877 A1 | 1/2015 | Moslehi |
| 2015/0075599 A1* | 3/2015 | Yu .............. H01L 31/02167 136/256 |
| 2015/0090314 A1 | 4/2015 | Yang |
| 2015/0096613 A1* | 4/2015 | Tjahjono .......... H01L 31/02242 136/256 |
| 2015/0114444 A1 | 4/2015 | Lentine |
| 2015/0171230 A1 | 6/2015 | Kapur |
| 2015/0214409 A1 | 7/2015 | Pfeiffer |
| 2015/0236177 A1* | 8/2015 | Fu .............. H01L 31/03520 136/255 |
| 2015/0270410 A1 | 9/2015 | Heng |
| 2015/0280641 A1 | 10/2015 | Garg |
| 2015/0349145 A1 | 12/2015 | Morad |
| 2015/0349153 A1 | 12/2015 | Morad |
| 2015/0349161 A1 | 12/2015 | Morad |
| 2015/0349162 A1 | 12/2015 | Morad |
| 2015/0349167 A1 | 12/2015 | Morad |
| 2015/0349168 A1 | 12/2015 | Morad |
| 2015/0349169 A1 | 12/2015 | Morad |
| 2015/0349170 A1 | 12/2015 | Morad |
| 2015/0349171 A1 | 12/2015 | Morad |
| 2015/0349172 A1 | 12/2015 | Morad |
| 2015/0349173 A1 | 12/2015 | Morad |
| 2015/0349174 A1 | 12/2015 | Morad |
| 2015/0349175 A1 | 12/2015 | Morad |
| 2015/0349176 A1 | 12/2015 | Morad |
| 2015/0349190 A1 | 12/2015 | Morad |
| 2015/0349193 A1 | 12/2015 | Morad |
| 2015/0349701 A1 | 12/2015 | Morad |
| 2015/0349702 A1 | 12/2015 | Morad |
| 2015/0349703 A1 | 12/2015 | Morad |
| 2016/0190354 A1 | 6/2016 | Agrawal |
| 2016/0204289 A1* | 7/2016 | Tao .............. C25D 3/665 136/256 |
| 2016/0329443 A1* | 11/2016 | Wang .............. H01L 31/02246 |

FOREIGN PATENT DOCUMENTS

| | | |
|---|---|---|
| CN | 101233620 | 7/2008 |
| CN | 101553933 | 10/2009 |
| CN | 100580957 C | 1/2010 |
| CN | 101305454 | 5/2010 |
| CN | 102088040 | 6/2011 |
| CN | 102263157 | 11/2011 |
| CN | 104409402 | 3/2015 |
| DE | 4030713 | 4/1992 |
| DE | 102006009194 | 8/2007 |
| DE | 202007002897 | 8/2008 |
| DE | 102008045522 | 3/2010 |
| DE | 102010061317 | 6/2012 |
| DE | 10201201051 | 11/2013 |
| DE | 102012010151 | 11/2013 |
| EP | 1770791 | 4/2007 |
| EP | 1816684 | 8/2007 |
| EP | 2071635 | 6/2009 |
| EP | 2113946 | 11/2009 |
| EP | 2362430 | 8/2011 |
| EP | 2385561 A2 | 11/2011 |
| EP | 2387079 | 11/2011 |
| EP | 2479796 A1 | 7/2012 |
| EP | 2626907 A1 | 8/2013 |
| EP | 2479796 | 7/2015 |
| EP | 2626907 | 8/2015 |
| JP | 5789269 | 6/1982 |
| JP | H04245683 A | 9/1992 |
| JP | H07249788 A | 9/1995 |
| JP | 10004204 | 1/1998 |
| JP | H1131834 | 2/1999 |
| JP | 2000164902 | 6/2000 |
| JP | 2002057357 A | 2/2002 |
| JP | 2005159312 A | 6/2005 |
| JP | 2006324504 | 11/2006 |
| JP | 2008135655 | 6/2008 |
| JP | 2009054748 | 3/2009 |
| JP | 2009177225 | 8/2009 |
| JP | 2013526045 | 6/2013 |
| JP | 2013161855 | 8/2013 |
| JP | 2013536512 | 9/2013 |
| JP | 2013537000 | 9/2013 |
| JP | 2013219378 | 10/2013 |
| JP | 2013233553 | 11/2013 |
| JP | 2013239694 | 11/2013 |
| JP | 2013247231 | 12/2013 |
| KR | 20050122721 A | 12/2005 |
| KR | 20060003277 A | 1/2006 |
| KR | 20090011519 A | 2/2009 |
| WO | 9117839 | 11/1991 |
| WO | 9120097 A1 | 12/1991 |
| WO | 03083953 A1 | 10/2003 |
| WO | 2006097189 A1 | 9/2006 |
| WO | 2008089657 | 7/2008 |
| WO | 2009094578 | 7/2009 |
| WO | 2009150654 | 12/2009 |
| WO | 2009150654 A2 | 12/2009 |
| WO | 2010070015 | 6/2010 |
| WO | 2010075606 | 7/2010 |
| WO | 2010075606 A1 | 7/2010 |
| WO | 2010085949 | 8/2010 |
| WO | 2010104726 A2 | 9/2010 |
| WO | 2010123974 | 10/2010 |
| WO | 2010123974 A1 | 10/2010 |
| WO | 2011005447 | 1/2011 |
| WO | 2011005447 A2 | 1/2011 |
| WO | 2011008881 | 1/2011 |
| WO | 2011008881 A2 | 1/2011 |
| WO | 2011053006 | 5/2011 |
| WO | 2011123646 A2 | 10/2011 |
| WO | 2013020590 | 2/2013 |
| WO | 2013020590 A1 | 2/2013 |
| WO | 2013046351 | 4/2013 |

(56) References Cited

FOREIGN PATENT DOCUMENTS

| WO | 2014066265 | 5/2014 |
|---|---|---|
| WO | 2014074826 | 5/2014 |
| WO | 2014110520 | 7/2014 |
| WO | 2014117138 | 7/2014 |
| WO | 2015183827 | 12/2015 |
| WO | 2016090332 | 6/2016 |

OTHER PUBLICATIONS

WP Leroy et al., "In Search for the Limits of Rotating Cylindrical Magnetron Sputtering", Magnetron, ION Processing and ARC Technologies European Conference, Jun. 18, 2010, pp. 1-32.

Beaucarne G et al: 'Epitaxial thin-film Si solar cells' Thin Solid Films, Elsevier-Sequoia S.A. Lausanne, CH LNKD—DOI:10.1016/J.TSF.Dec. 3, 2005, vol. 511-512, Jul. 26, 2006 (Jul. 26, 2006), pp. 533-542, XP025007243 ISSN: 0040-6090 [retrieved on Jul. 26, 2006].

Chabal, Yves J. et al., 'Silicon Surface and Interface Issues for Nanoelectronics,' The Electrochemical Society Interface, Spring 2005, pp. 31-33.

Collins English Dictionary (Convex. (2000). In Collins English Dictionary. http://search.credoreference.com/content/entry/hcengdict/convex/0 on Oct. 18, 2014).

Cui, 'Chapter 7 Dopant diffusion', publically available as early as Nov. 4, 2010 at <https://web.archive.org/web/20101104143332/http://ece.uwaterloo.ca/~bcui/content/NE/%20343/Chapter/%207%20Dopant%20 diffusion%20_%20I.pptx> and converted to PDF.

Davies, P.C.W., 'Quantum tunneling time,' Am. J. Phys. 73, Jan. 2005, pp. 23-27.

Dosaj V D et al: 'Single Crystal Silicon Ingot Pulled From Chemically-Upgraded Metallurgical-Grade Silicon' Conference Record of The IEEE Photovoltaic Specialists Conference, May 6, 1975 (May 6, 1975), pp. 275-279, XP001050345.

Green, Martin A. et al., 'High-Efficiency Silicon Solar Cells,' IEEE Transactions on Electron Devices, vol. ED-31, No. 5, May 1984, pp. 679-683.

Hamm, Gary, Wei, Lingyum, Jacques, Dave, Development of a Plated Nickel Seed Layer for Front Side Metallization of Silicon Solar Cells, EU PVSEC Proceedings, Presented Sep. 2009.

JCS Pires, J Otubo, AFB Braga, PR Mei; The purification of metallurgical grade silicon by electron beam melting, J of Mats Process Tech 169 (2005) 16-20.

Khattak, C. P. et al., "Refining Molten Metallurgical Grade Silicon for use as Feedstock for Photovoltaic Applications", 16th E.C. Photovoltaic Solar Energy Conference, May 1-5, 2000, pp. 1282-1283.

Merriam-Webster online dictionary—"mesh". (accessed Oct. 8, 2012).

Mueller, Thomas, et al. "Application of wide-band gap hydrogenated amorphous silicon oxide layers to heterojunction solar cells for high quality passivation." Photovoltaic Specialists Conference, 2008. PVSC'08. 33rd IEEE. IEEE, 2008.

Mueller, Thomas, et al. "High quality passivation for heterojunction solar cells by hydrogenated amorphous silicon suboxide films." Applied Physics Letters 92.3 (2008): 033504-033504.

Munzer, K.A. "High Throughput Industrial In-Line Boron BSF Diffusion" Jun. 2005. 20th European Photovoltaic Solar Energy Conference, pp. 777-780.

National Weather Service Weather Forecast Office ("Why Do We have Seasons?" http://www.crh.noaa.gov/lmk/?n=seasons Accessed Oct. 18, 2014).

O'Mara, W.C.; Herring, R.B.; Hunt L.P. (1990). Handbook of Semiconductor Silicon Technology. William Andrew Publishing/Noyes. pp. 275-293.

Roedern, B. von, et al., 'Why is the Open-Circuit Voltage of Crystalline Si Solar Cells so Critically Dependent on Emitter-and Base-Doping?' Presented at the 9th Workshop on Crystalline Silicon Solar Cell Materials and Processes, Breckenridge, CO, Aug. 9-11, 1999.

Stangl et al., Amorphous/Crystalline Silicon heterojunction solar cells—a simulation study; 17th European Photovoltaic Conference, Munich, Oct. 2001.

Warabisako T et al: 'Efficient Solar Cells From Metallurgical-Grade Silicon' Japanese Journal of Applied Physics, Japan Society of Applied Physics, JP, vol. 19, No. Suppl. 19-01, Jan. 1, 1980 (Jan. 1, 1980), pp. 539-544, XP008036363 ISSN: 0021-4922.

Yao Wen-Jie et al: 'Interdisciplinary Physics and Related Areas of Science and Technology;The p recombination layer in tunnel junctions for micromorph tandem solar cells', Chinese Physics B, Chinese Physics B, Bristol GB, vol. 20, No. 7, Jul. 26, 2011 (Jul. 26, 2011), p. 78402, XP020207379, ISSN: 1674-1056, DOI: 10.1088/1674-1056/20/7/078402.

Parthavi, "Doping by Diffusion and Implantation", <http://www.leb.eei.uni-erlangen.de/winterakademie/2010/report/course03/pdf/0306.pdf>.

Weiss, "Development of different copper seed layers with respect to the copper electroplating process," Microelectronic Engineering 50 (2000) 443-440, Mar. 15, 2000.

Tomasi, "Back-contacted Silicon Heterojunction Solar Cells With Efficiency>21%" 2014 IEEE.

Hornbachner et al., "Cambered Photovoltaic Module and Method for its Manufacture" Jun. 17, 2009.

Jianhua Zhao et al. "24% Efficient perl silicon solar cell: Recent improvements in high efficiency silicon cell research".

"Nonequilibrium boron doping effects in low-temperature epitaxial silicon" Meyerson et al., Appl. Phys. Lett. 50 (2), p. 113 (1987).

"Doping Diffusion and Implantation" Parthavi, <http://www.leb.eei.uni-erlangen.de/winterakademie/2010/report/content/course03/pdf/0306.pdf>.

Meyerson et al. "Nonequilibrium boron doping effects in low-temperature epitaxial silicon", Appl. Phys. Lett. 50 (2), p. 113 (1987).

Li, "Surface and Bulk Passsivation of Multicrystalline Silicon Solar Cells by Silicon Nitride (H) Layer: Modeling and Experiments", Ph.D. dissertation, N.J. Inst. of Tech., Jan. 2009.

Kanani, Nasser. Electroplating: Basic Principles, Processes and Practice, Chapter 8—"Coating Thickness and its Measurement," 2004, pp. 247-291.

P. Borden et al. "Polysilicon Tunnel Junctions as Alternates to Diffused Junctions" Proceedings of the 23rd European Photovoltaic Solar Energy Conference, Sep. 1, 2008-Sep. 5, 2008, pp. 1149-1152.

L. Korte et al. "Overview on a-Se:H/c heterojunction solar cells—physics and technology", Proceedings of the 22nd European Photovoltaic Solar Energy Conference, Sep. 3, 2007-Sep. 7, 2007, pp. 859-865.

\* cited by examiner

2A

2D

2B

2E

2C (optional)

2F (QDR)

2G

2H

2I

2J

SYSTEM AND METHOD FOR MASS-PRODUCTION OF HIGH-EFFICIENCY PHOTOVOLTAIC STRUCTURES

FIELD OF THE INVENTION

This is generally related to fabrication of photovoltaic structures. More specifically, this is related to a system and method for mass fabrication of high-efficiency photovoltaic structures.

DEFINITIONS

"Solar cell" or "cell" is a photovoltaic structure capable of converting light into electricity. A cell may have any size and any shape, and may be created from a variety of materials. For example, a solar cell may be a photovoltaic structure fabricated on a silicon wafer or one or more thin films on a substrate material (e.g., glass, plastic, or any other material capable of supporting the photovoltaic structure), or a combination thereof.

A "photovoltaic structure" can refer to a solar cell, a segment, or a solar cell strip. A photovoltaic structure is not limited to a device fabricated by a particular method. For example, a photovoltaic structure can be a crystalline silicon-based solar cell, a thin film solar cell, an amorphous silicon-based solar cell, a poly-crystalline silicon-based solar cell, or a strip thereof.

BACKGROUND

Large-scale production of high-efficiency solar cells plays an important role in ensuring the success of solar power over conventional energy sources that are based on fossil fuels. However, most of the current processes for manufacturing high-efficiency solar cells are not optimized for mass production. For example, many laboratory-made solar cells demonstrate superior performance, but the fabrication process for those solar cells cannot be applied in a mass production environment.

It has been shown that double-junction heterojunction solar cells can demonstrate higher efficiency than single-junction solar cells. However, mass production of double-junction solar cells can be challenging, because the double-junction structure can require excellent surface passivation on both surfaces of the crystalline Si substrates, whereas the current fabrication process often leads to contamination on one side of the solar cells.

SUMMARY

One embodiment of the invention can provide a system for fabricating a photovoltaic structure. During fabrication, the system can form a sacrificial layer on a first side of a Si substrate; load the Si substrate into a chemical vapor deposition tool, with the sacrificial layer in contact with a wafer carrier; and form a first doped Si layer on a second side of the Si substrate. The system subsequently can remove the sacrificial layer; load the Si substrate into a chemical vapor deposition tool, with the first doped Si layer facing a wafer carrier; and form a second doped Si layer on the first side of the Si substrate.

In a variation of the embodiment, forming the sacrificial layer can involve one or more operations selected from a group consisting of: wet oxidation to form an oxide layer, thermal oxidation to form an oxide layer, low-pressure radical oxidation to form an oxide layer, atomic layer deposition to form an oxide layer or a semiconductor layer, and chemical-vapor deposition to form an oxide layer or a semiconductor layer.

In a variation of the embodiment, a thickness of the sacrificial layer can be between 1 and 50 angstroms.

In a variation of the embodiment, the system can perform a quick dump rinsing operation prior to removing the sacrificial layer.

In a variation of the embodiment, the sacrificial layer can include an oxide layer, and removing the sacrificial layer can involve performing a diluted hydrofluoric acid dip.

In a further variation, a concentration of the diluted hydrofluoric acid can be between 0.1 and 5%.

In a variation of the embodiment, the system can form a passivation layer positioned between the Si substrate and the first doped Si layer, and the passivation layer can include one or more materials selected from a group consisting of: aluminum oxide, amorphous Si, amorphous SiC, and intrinsic hydrogenated amorphous Si incorporated with oxygen.

In a variation of the embodiment, the system can form a passivation layer positioned between the Si substrate and the second doped Si layer, and the passivation layer can include one or more materials selected from a group consisting of: aluminum oxide, amorphous Si, amorphous SiC, and intrinsic hydrogenated amorphous Si incorporated with oxygen.

In a variation of the embodiment, the first doped Si layer can have a graded doping profile, and a doping concentration of the first doped Si layer near a surface away from the Si substrate can be greater than $3 \times 10^{19}/cm^3$.

In a variation of the embodiment, the system can perform one or more operations selected from a group consisting of: forming a transparent conductive oxide layer on the first doped Si layer and forming a transparent conductive oxide layer on the second doped Si layer.

BRIEF DESCRIPTION OF THE FIGURES

In the figures, like reference numerals refer to the same figure elements.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the invention is not limited to the embodiments shown, but is to be accorded the widest scope consistent with the principles and features disclosed herein.

Overview

Embodiments of the present invention can provide a system and method for fabricating high-efficiency photovoltaic structures. To ensure a high quality surface on both sides of a photovoltaic structure, the fabrication process can start with oxidation on both sides of a crystalline Si wafer, followed by formation of a semiconductor layer stack on one side. The semiconductor layer stack typically can include a heavily doped layer. While forming the heavily doped layer on one side, the opposite side of the photovoltaic structure can experience a counter doping effect, i.e., the opposite side can be contaminated by the dopants. To reduce the interface defects on the opposite side, after formation of the first layer stack, the photovoltaic structure can be submerged into diluted hydrofluoric acid (HF) to remove the previously formed oxide layer (which can act as a sacrificial layer) on the opposite side. The contaminations on the opposite side can then be removed along with the sacrificial layer. The photovoltaic structure can be further rinsed to remove large particles. The fabrication process can continue with forming the layer stack on the opposite side.

In this disclosure, the side of the photovoltaic structure that first undergoes fabrication processes can be referred to as the "front side" of the photovoltaic structure, and the other side that subsequently undergoes fabrication processes can be referred to as the "back side." Both the "front side" and the "back side" are relative terms, and can be used to refer to any side of the photovoltaic structure.

Double-Junction Photovoltaic Structures and Fabrication Processes

Figure 1A:
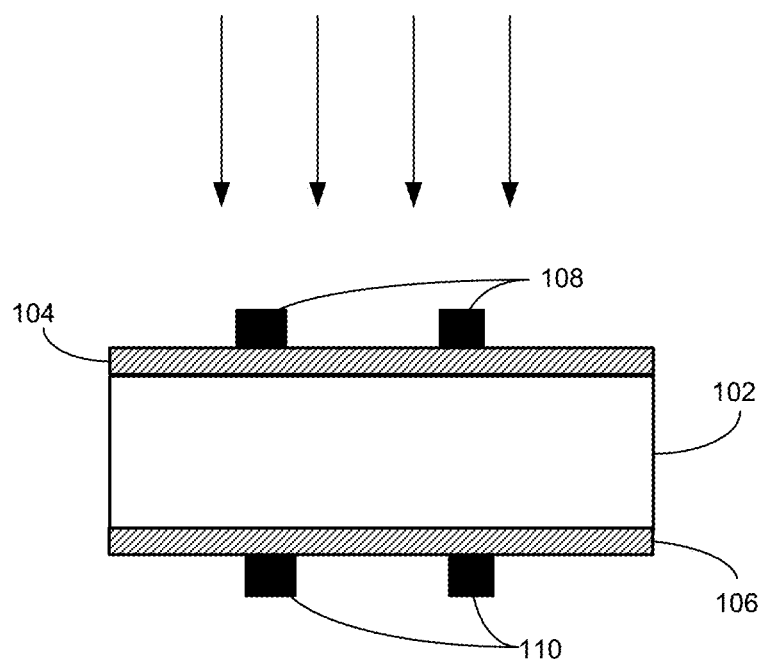
FIG. 1A shows an exemplary double-sided heterojunction photovoltaic structure.

FIG. 1A shows an exemplary double-junction heterojunction photovoltaic structure. In FIG. 1A, photovoltaic structure 100 can include substrate 102, surface-field layer 104, emitter layer 106, and electrode grids 108 and 110. In the example shown in FIG. 1A, substrate 102 can include a lightly doped or substantially intrinsic crystalline Si (c-Si) layer; surface-field layer 104 can include a heavily doped c-Si layer; and emitter layer 106 can include a heavily doped amorphous Si (a-Si) layer.

Also in FIG. 1A, surface-field layer 104 can face the majority of incident light (as indicated by arrows), and hence can also be called the front surface-field (FSF) layer. Substrate 102 can either be doped with n-type dopants (e.g., phosphorus) or p-type dopants (e.g., boron). The doping types of FSF layer 104 and emitter layer 106 can be determined by the doping type of substrate 102. For an n-type doped substrate, FSF layer 104 can be doped with n-type dopants to act as an electron collector; and emitter layer 106 can be doped with p-type dopants to act as a hole collector.

As one can see from FIG. 1A, photovoltaic structure 100 can include two junctions, a junction formed between FSF layer 104 and substrate 102 and a junction formed between emitter layer 106 and substrate 102. To ensure high efficiency, it can be desirable to reduce the interface defect density ($D_{it}$) at both junctions. This means that good passivation on both sides of substrate 102 may be desired prior to the deposition of FSF layer 104 and emitter layer 106. However, because of the processing (e.g., material deposition) on both sides of substrate 102, it can be challenging to achieve good bifacial passivation.

Good passivation on one side of a Si wafer has been achieved by the CMOS industry. The fabrication process for CMOS transistors can control the defects on one side of the Si wafer, with the opposite side going through various handling and contacts. Because the CMOS structure is located on one side of the wafer, defects on the other side do not affect device yield and performance. This is not the case for the fabrication of photovoltaic structures. A typical fabrication process for photovoltaic structure 100 can include deposition of emitter layer 106 on one side of substrate 102, followed by the deposition of surface-field layer 104 on the opposite side of substrate 102. Because material deposition on one side of substrate 102 may contaminate the other side (e.g., the counter doping effect), it can be difficult to maintain low $D_{it}$ on both sides of substrate 102. Furthermore, large-scale, automated fabrication processes can require that the substrates be carried from one processing station to the next by conveyors, and contacts between the substrates and the conveyors may also contaminate or damage the surface of the substrates.

For example, during the deposition of boron-doped amorphous Si, boron-containing radicals can attach to wafer carriers, and eventually attach to the back side of any subsequent substrates loaded onto the wafer carriers. A detailed, microscopy-based failure analysis can also find organic and amorphous Si particles on the substrate. Although cleaning procedures can reduce the number of attached particles, cleaning the wafer carriers after each round of deposition can significantly reduce the system throughput, and may not be able to eliminate all particles. Moreover, "belt mark" related defects can also be observed on substrates carried by conveyer systems. These surface defects can lead to various performance degradations, such as smaller maximum output power ($P_{max}$) and lower fill factors, of the photovoltaic structures. These performance degradations can be sensitive to processing conditions (e.g., time since the last wafer carrier cleaning), making it difficult to predict manufacture yield. In extreme cases, the fabricated solar panel may include a "hot" cell due to its lower reverse breakdown voltage or instant shunting of a particular cell.

Figure 1B:
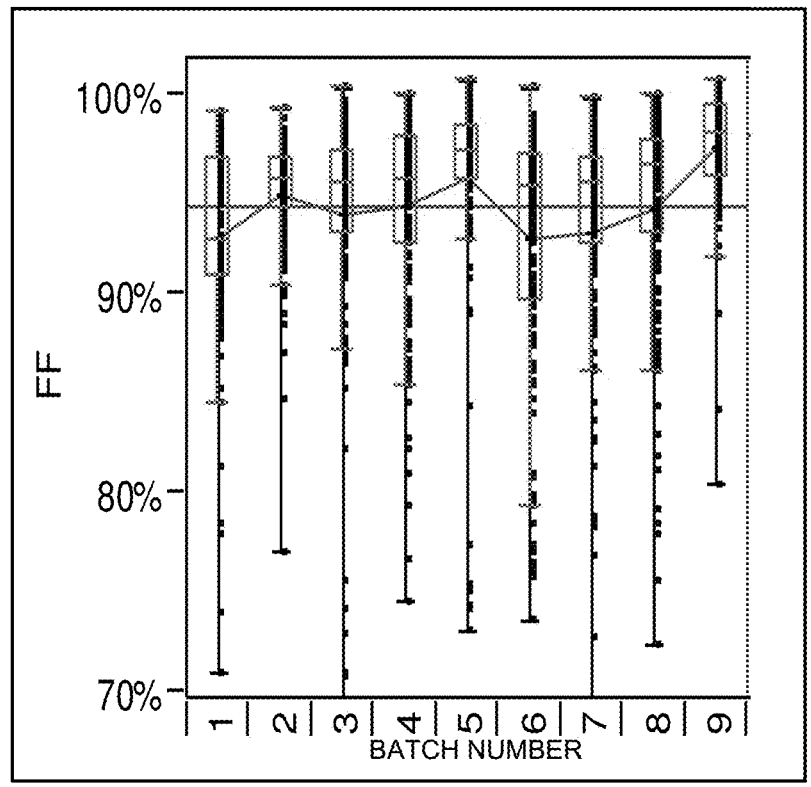
FIG. 1B shows the performance variation of photovoltaic structures fabricated using difference processes.
Figure 1B:
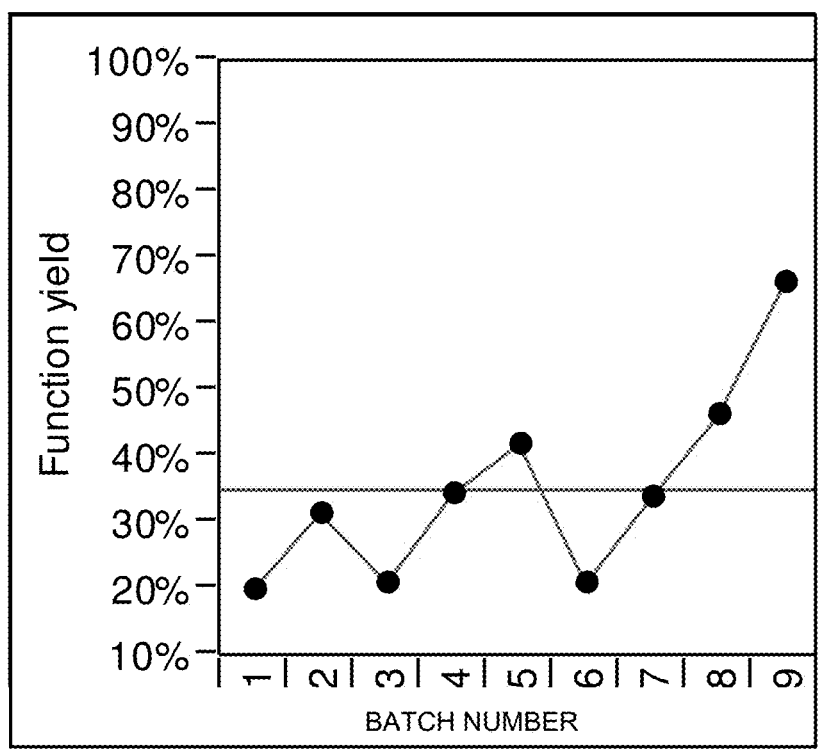

FIG. 1B shows the performance variation of photovoltaic structures fabricated using difference processes. The top chart shows the variation in the normalized fill factor (FF) for a number of batches of photovoltaic structures fabricated using a conventional process. The bottom chart shows the variation in the function yield (percentage of devices that meet the performance requirement). As one can see, there is a huge variation in FF for devices made in each batch or in different batches. Moreover, the yields are relatively low (around 40%) and vary significantly among batches.

One approach for removing the surface defects is to perform chemical cleaning after material deposition on one side of the substrate. However, standard chemical cleaning processes (e.g., RCA-1 clean and RCA-2 clean) can damage, even completely remove, the previously deposited layer stack. To solve this problem, embodiments of the present invention provide a novel fabrication process that can include an additional step of oxidation on both sides of the substrate prior to layer deposition and a bath in a diluted HF solution after the layer deposition on one side. This fabrication process can be suitable for large-scale, automated fabrications of high efficiency photovoltaic structures.

Figure 2:
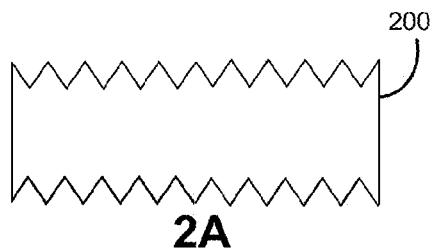
FIG. 2 shows an exemplary fabrication process of a photovoltaic structure, according to an embodiment of the present invention.
Figure 2:
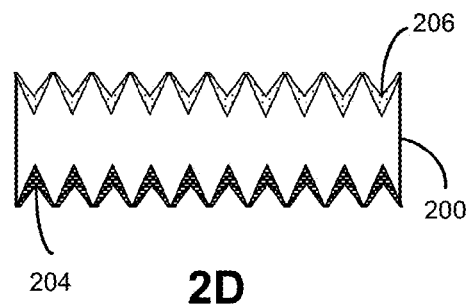
Figure 2:
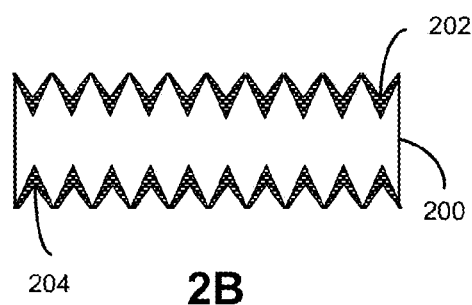
Figure 2:
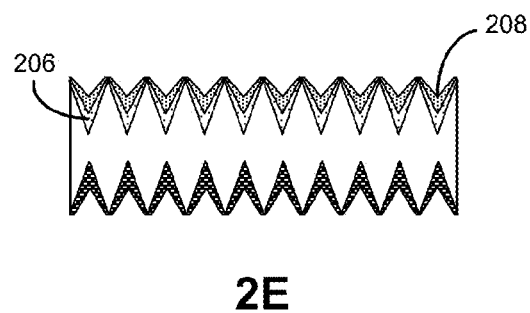
Figure 2:
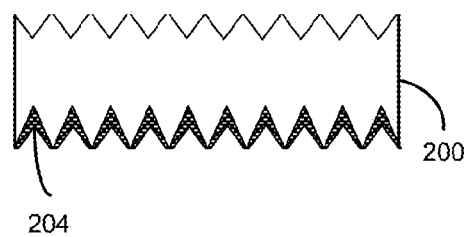
Figure 2:
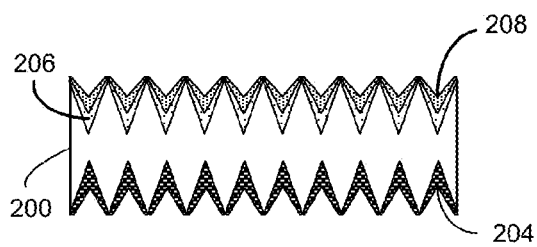
Figure 2:
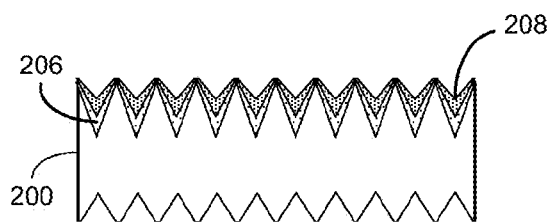
Figure 2:
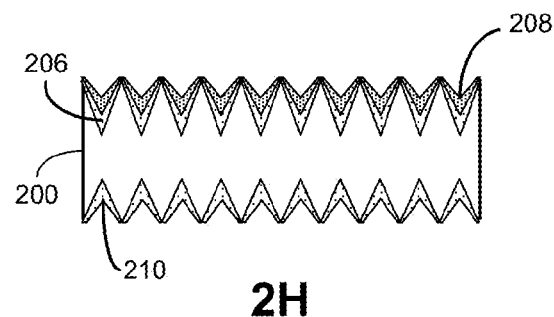
Figure 2:
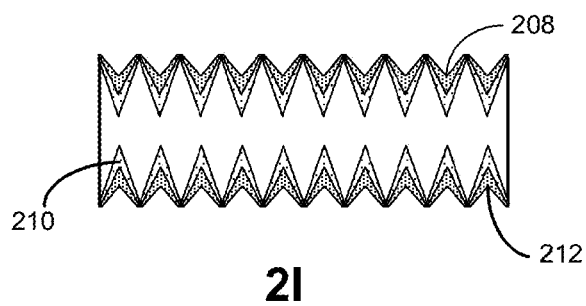
Figure 2:
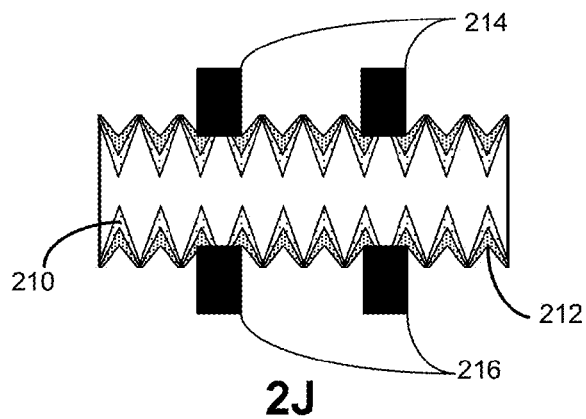

FIG. 2 shows an exemplary fabrication process of a photovoltaic structure, according to an embodiment of the present invention. In operation 2A, substrate 200 is prepared. In some embodiments, substrate 200 can include a solar grade Si (SG-Si) wafer, which can be epitaxially grown or prepared using a Czochralski (CZ) or Float Zone (FZ) method. The thickness of substrate 200 can be between 80 and 300 microns, preferably between 110 and 180 microns. The resistivity of the SG-Si wafer can range from 0.5 ohm-cm to 10 ohm-cm. Substrate 200 can be intrinsic or lightly doped with n- or p-type dopants. In some embodiments, substrate 200 can be doped with n-type dopants and can have a doping concentration ranging from $1\times10^{10}/cm^3$ to $1\times10^{16}/cm^3$. In further embodiments, substrate 200 can have a graded doping profile. The preparation operation can include typical saw damage etching that removes approximately 10 µm of silicon and surface texturing. The surface texture can have various patterns, including but not limited to: hexagonal-pyramid, inverted pyramid, cylinder, cone, ring, and other irregular shapes. In one embodiment, the surface texturing operation can result in a random pyramid textured surface. Afterwards, substrate 200 can go through extensive surface cleaning. For illustration purposes, the surface textures shown in the drawings are not drawn to scale.

In operation 2B, a thin layer of oxide can be formed on both the front and back surfaces of Si substrate 200 to form front and back oxide layers 202 and 204, respectively. In some embodiments, only the back surface of Si substrate 200 can be covered with a thin layer of oxide. Various oxidation techniques can be used to form the oxide layers, including, but not limited to: wet oxidation using oxygen or ozone bubbling at low temperatures, dry oxidation at relatively high temperatures (around or below 400° C.) (also known as thermal oxidation), low-pressure radical oxidation, atomic layer deposition (ALD) of a $SiO_2$ layer, plasma-enhanced chemical-vapor deposition (PECVD) of a $SiO_2$ layer, etc. The oxide layers can also include native oxide. The thickness of oxide layers 202 and 204 can be between 1 and 50 angstroms, preferably between 1 and 10 angstroms. Oxide layers 202 and 204 should be thick enough (at least between 1 and 2 monolayers) to serve their purposes, e.g., passivation or functioning as a sacrificial layer.

In an optional operation 2C, front oxide layer 202 can be removed using plasma bombardment or chemical etching. This operation is optional, because front oxide layer 202 can also be used for passivation purposes after atomic hydrogen treatment.

In operation 2D, thin passivation layer 206 can be deposited on the front surface of substrate 200. Passivation layer 206 can be formed using various materials, including but not limited to: aluminum oxide, a-Si, a-SiC, intrinsic hydrogenated a-Si films incorporated with oxygen (i a-Si(H,O):H). Various deposition techniques can be used to deposit passivation layer 206, including, but not limited to: thermal oxidation, atomic layer deposition, low-pressure radical oxidation, PECVD, hot wire CVD, etc. The thickness of passivation layer 206 can be between 1 and 50 angstroms.

In operation 2E, emitter layer 208 can be deposited on passivation layer 206. The doping type of emitter layer 208 can be opposite to that of substrate 200. For n-type doped substrate, emitter layer 208 can be p-type doped. Emitter layer 208 can include a-Si or hydrogenated a-Si (a-Si:H). The thickness of emitter layer 208 can be between 2 and 50 nm, preferably between 4 and 8 nm. In some embodiments, emitter layer 208 can have a graded doping profile. The doping profile of emitter layer 206 can be optimized to ensure good ohmic contact, minimum light absorption, and a large built-in electrical field. In some embodiments, the doping concentration of emitter layer 208 can range from $1\times10^{15}/cm^3$ to $5\times10^{20}/cm^3$. In further embodiments, the region within emitter layer 208 that is adjacent to passivation layer 206 can have a lower doping concentration, and the region that is away from passivation layer 206 can have a higher doping concentration. The lower doping concentration at the interface between passivation layer 206 and emitter layer 208 can ensure minimum interface defect density, and the higher concentration on the other side can prevent emitter layer depletion. In one embodiment, the doping concentration of emitter layer 208 at the surface away from the passivation layer can be greater than $3\times10^{19}/cm^3$ to ensure that emitter layer 208 will not be damaged by a subsequent submergence in an HF solution. The crystal structure of emitter layer 208 can either be nanocrystalline, which can enable higher carrier mobility, or protocrystalline, which can enable good absorption in the ultra-violet (UV) wavelength range and good transmission in the infrared (IR) wavelength range. Both crystalline structures need to preserve the large bandgap of the a-Si. For higher film conductivity and better moisture barrier performance, the finishing surface of emitter layer 208 (the surface away from passivation layer 206) should have a nanocrystalline structure. Various deposition techniques can be used to deposit emitter layer 206, including, but not limited to: atomic layer deposition, PECVD, hot wire CVD, etc. In some embodiments, the deposition of thin passivation layer 206 and emitter layer 208 can be performed using the same deposition tool. This approach can significantly improve the system throughput, because there is no need for pumping down the vacuum chamber between the two depositions.

After the formation of the p-type layer stack (which can include passivation layer 206 and p-type emitter layer 208) on the front surface of substrate 200, the photovoltaic structure needs to be transferred out of the deposition tool for further processing. As a result, the back surface of substrate 200 may experience various handling related damages, such as "belt mark" related defects. For a system that implements a PECVD tool for material deposition, there is also a chance of buildup of charged particles at the back surface of substrate 200, which can be the result of plasma ignition. Moreover, boron-containing radicals may also attach to the back surface of substrate 200, causing counter doping. Without a countermeasure, all these damages/defects can increase the interface defect density ($D_{it}$) at the back surface of substrate 200, which can further lead to a low fill factor of the fabricated devices and unstable process yield.

Some of the large particles (e.g., a-Si or organic particles) attached to the photovoltaic structure can be removed using physical forces. In operation 2F, the semi-finished photovoltaic structure (including substrate 200, passivation layer 206, emitter layer 208, and back side oxide layer 204) can go through a few cycles of quick dump rinsing (QDR), which can physically remove large particles on surfaces of the photovoltaic structure. However, other defects (e.g., counter doping and belt marks) cannot be removed by this operation.

To further reduce the $D_{it}$ at the back surface of substrate 200, in some embodiments, back side oxide layer 204 can be removed in operation 2G. More specifically, in operation 2G, the semi-finished photovoltaic structure, including substrate 200, passivation layer 206, emitter layer 208, and back side oxide layer 204, can be dipped into a diluted hydrofluoric acid (HF) solution. The HF solution can have a concentration ranging from 0.1 to 5%, preferably between 1 and 2%. The photovoltaic structure can be submerged into the diluted HF solution for a short time duration that can be between 1 and 5 minutes, preferably between 1 and 2 minutes. This operation can also be referred to as a diluted HF dip. In one embodiment, the photovoltaic structure can be submerged into a 1% HF solution for 2 minutes. The diluted HF dip can remove back side oxide layer 204, which can function as a sacrificial layer. Consequently, all defects attached to the back side of the photovoltaic structure (e.g., boron related radicals and belt marks) can be removed along with back side oxide layer 204. Because the etch rate of heavily p-type doped c-Si, doped or intrinsic a-Si, or SiO is very low in diluted HF solutions, this diluted HF dip will not damage the previously deposited p-type layer stack (i.e., passivation layer 206 and emitter layer 208). In addition to HF, other etchants, such as an Ammonium Fluoride ($NH_4F$) solution or a buffered HF solution, can also be used to etch off back side oxide layer 204.

Operation 2G can further include a cleaning process for removing residual HF acid. In some embodiments, the cleaning process can include rinsing the photovoltaic structure using room temperature deionized (DI) water by submerging and then pulling the photovoltaic structure in and out of a DI water bath. In further embodiments, the pulling is performed in slow motion to leave the front surface of the photovoltaic structure water free, whereas the opposite surface can remain hydrophilic. To completely dry the photovoltaic structure, operation 2G can also include a warm $N_2$ blow dry process.

After operation 2G, both sides of the photovoltaic structure can be clean and defect free. In some embodiments, an optional oxidation process (not shown in FIG. 2) can be included to reintroduce an oxide layer on the back surface of substrate 200. Unlike back side oxide layer 204, this new oxide layer did not go through the fabrication process of the p-side layer stack, and hence can be defect free.

In operation 2H, back side passivation layer 210 can be formed on the back surface of substrate 200. Back side passivation layer 210 can be similar to passivation layer 206, and operation 2H can be similar to operation 2D. When depositing back side passivation layer 210, the photovoltaic structure needs to be flipped over, with emitter layer 208 in contact with the wafer carrier. Because emitter layer 208 can be relatively thick and the exposed surface of emitter layer 208 can be heavily doped with dopants (e.g., boron ions), this side of the photovoltaic structure is not sensitive to surface contact. For example, transporting the photovoltaic structure using a conveyor belt may not generate belt marks on the surface of emitter layer 208.

In operation 2I, surface field layer 212 can be formed on back side passivation layer 210. Surface field layer 212 can have the same doping type as that of substrate 200. For an n-type doped substrate, surface field layer 212 can also be n-type doped. Other than the conductive doping type, surface field layer 212 can be similar to emitter layer 208 by having similar material make up, thickness, doping profile, and crystal structure. For example, like emitter layer 208, surface field layer 212 can include a-Si or a-Si:H, and can have a thickness between 2 and 50 nm, preferably between 4 and 8 nm. In some embodiments, the doping concentration of surface field layer 212 can range from $1\times10^{15}/cm^3$ to $5\times10^{20}/cm^3$. In further embodiments, the region within surface field layer 212 that is adjacent to back side passivation layer 210 can have a lower doping concentration, and the region that is away from back side passivation layer 210 can have a higher doping concentration. Various deposition techniques can be used to deposit surface field layer 212, including, but not limited to: atomic layer deposition, PECVD, hot wire CVD, etc. In some embodiments, the deposition of back side passivation layer 210 and surface field layer 212 can be performed using the same deposition tool.

In operation 2J, front-side electrode 214 and back-side electrode 216 can be formed on the surface of emitter layer 208 and surface field layer 212, respectively. In some embodiments, front-side electrode 214 and back-side electrode 216 each can include a Cu grid formed using various metallization techniques, including, but not limited to: electroless plating, electroplating, sputtering, and evaporation. In further embodiments, the Cu grid can include a Cu seed layer that can be deposited onto emitter layer 208 or surface field layer 212 using a physical vapor deposition (PVD) technique, such as sputtering and evaporation, and an electroplated bulk Cu layer. The bulk Cu layer can be at least tens of microns thick (e.g., greater than 30 microns) to ensure low series resistivity.

Figure 3:
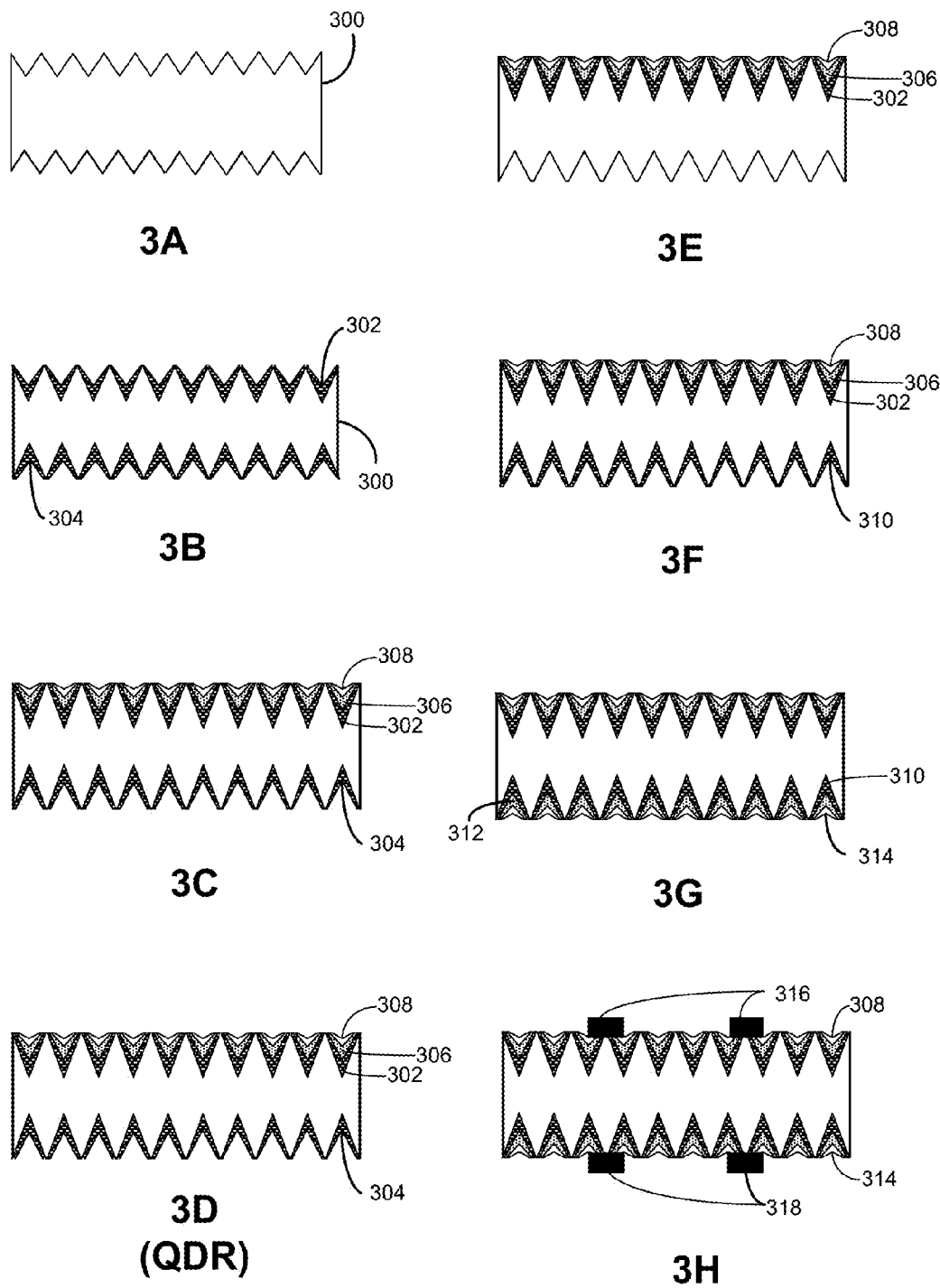
FIG. 3 shows an exemplary fabrication process of a photovoltaic structure, according to an embodiment of the present invention.

FIG. 3 shows an exemplary fabrication process of a photovoltaic structure, according to an embodiment of the present invention. The fabrication process can be similar to the one shown in FIG. 2, except that, in FIG. 3, the front oxide layer can be maintained for passivation purposes, and the fabrication process can further include forming front and back side transparent conductive oxide (TCO) layers.

In operation 3A, substrate 300 can be prepared using a process similar to that of operation 2A.

In operation 3B, front oxide layer 302 and back oxide layer 304 can be formed on both surfaces of substrate 300, using a process similar to that of operation 2B.

In operation 3C, the front side layer stack, which can include emitter layer 306 and TCO layer 308, can be formed on the surface of front oxide layer 302. If substrate 300 is n-type doped, this layer stack can also be called the p-side layer stack because it includes p-type doped emitter layer 306. The process for forming emitter layer 306 can be similar to that of operation 2E. Because front side oxide layer 302 is not removed during fabrication, there may not be a need to deposit a passivation layer. Front side oxide layer 302 can function as a passivation layer, as well as a tunneling layer. TCO layer 308 can be formed using a physical vapor deposition (PVD) process, such as sputtering or evaporation. Materials used to form TCO layer 308 can include, but are not limited to: tungsten doped indium oxide (IWO), indium-tin-oxide (ITO), GaInO (GIO), GaInSnO (GITO), ZnInO (ZIO), ZnInSnO (ZITO), tin-oxide ($SnO_x$), aluminum doped zinc-oxide (ZnO:Al or AZO), gallium doped zinc-oxide (ZnO:Ga), and their combinations.

After the formation of the p-side layer stack, the semifinished photovoltaic structure can go through a QDR process (operation 3D) to remove loose particles resulting from the previous CVD and PVD processes. Operation 3D can be similar to operation 2F.

In operation 3E, back side oxide layer 304 can be removed using a process similar to that of operation 2G. Removing back side oxide layer 304 can remove the various defects that are attached to or on the surface of back side oxide layer 304.

In operation 3F, back side passivation layer 310 can be deposited on the back surface of substrate 300, using a process similar to operation 2D or 2H. Alternatively, thin oxide layer 310 can be formed on the back surface of substrate 300, acting as a passivation/tunneling layer.

In operation 3G, the back side layer stack, which can include surface field layer 312 and TCO layer 314, can be formed on the surface of back side passivation layer 310. If substrate 300 is n-type doped, this layer stack can also be called the n-side layer stack, because it includes n-type doped surface field layer 312. The process for forming surface field layer 312 can be similar to that of operation 2I. The process and materials used to form TCO layer 314 can be similar to those used to form TCO layer 308.

In operation 3H, front and back electrodes 316 and 318 can be formed on the surface of TCO layers 308 and 314, respectively, using a process similar to that of operation 2J.

Fabrication System

Figure 4A:
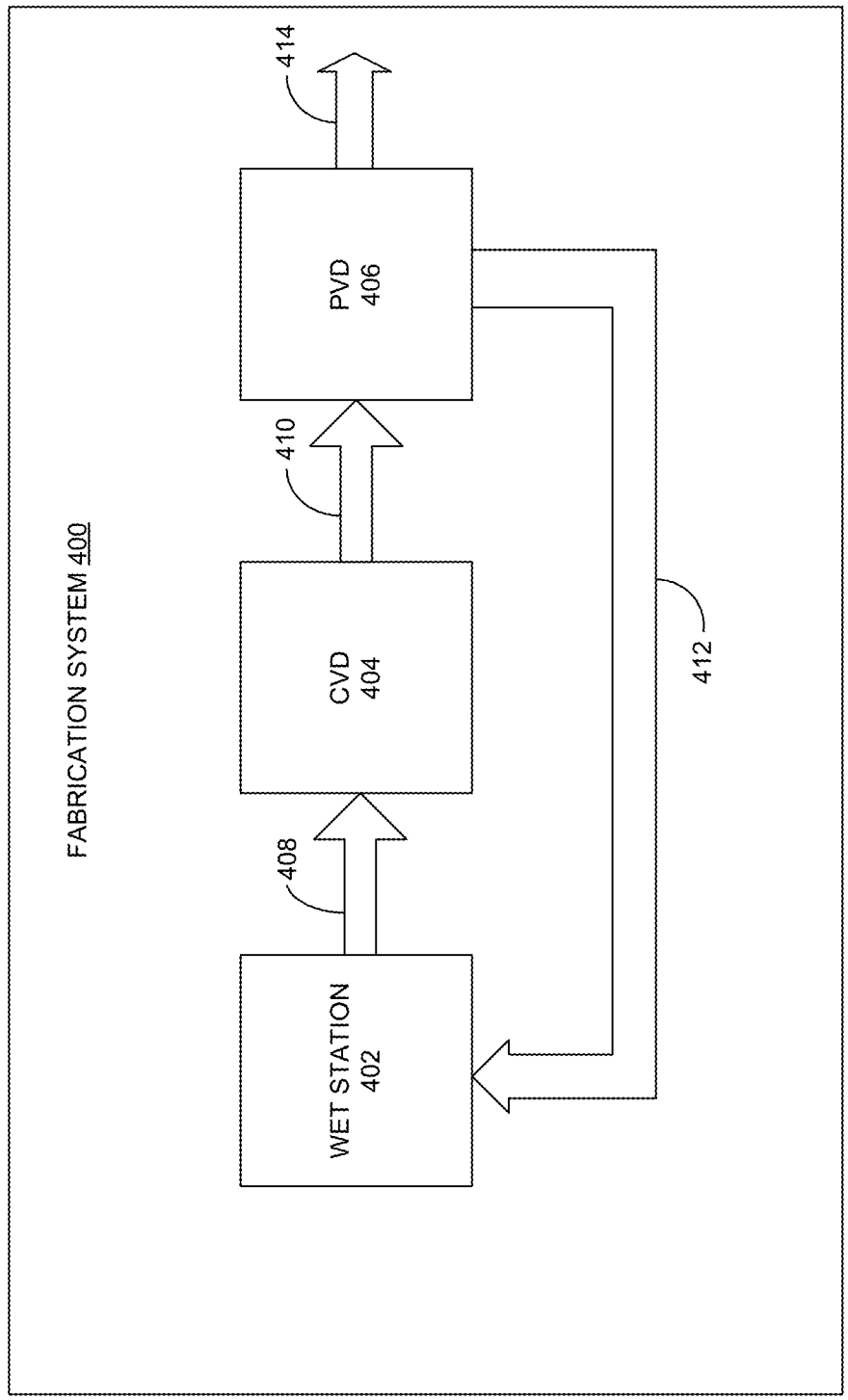
FIG. 4A shows an exemplary fabrication system, according to an embodiment of the present invention.

This modified fabrication process can be compatible with various large-scale, automated photovoltaic structure fabrication systems. In general, this process can be used to fabricate a wide range of photovoltaic structures that have contact on both sides. FIG. 4A shows an exemplary fabrication system, according to an embodiment of the present invention.

In FIG. 4A, fabrication system 400 can include wet station 402, CVD tool 404, and PVD tool 406. Wet station 402 (also known as a wet bench) can include a number of baths, each containing a particular solution, used for the various wet processes (e.g., surface cleaning and texturing, wet oxidation, QDR, diluted HF dip, etc). For large-scale fabrications, wet station 402 can process Si substrates in batches, with each batch including tens or hundreds of Si substrates. During fabrication, crystalline Si wafers can first undergo a number of wet processes at wet station 402, including surface cleaning, saw-damage removing, surface texturing, and wet oxidation.

The substrates emerging from wet station 402 can have a thin oxide layer formed on both the front and back surfaces, and can be loaded onto a wafer carrier with one side up. The wafer carrier can then be sent to CVD tool 404 (as indicated by hollow arrow 408) for material deposition. In some embodiments, a wafer carrier can carry over 100 Si wafers (e.g., 5-inch or 6-inch square or pseudo-square Si wafers) to allow simultaneous material deposition on these wafers. The wafer carrier can be a graphite or carbon fiber composite (CFC) carrier coated with a low-porosity material, such as pyrolytic carbon or silicon carbide. The wafer carrier may also include a non-flat surface or a partially carved-out structure at the bottom of the wafer-holding pockets.

In some embodiments, CVD tool 404 can be configured to optionally remove the exposed oxide layer and then sequentially deposit a passivation layer and an emitter layer. In alternative embodiments, CVD tool 404 can be configured to deposit an emitter layer directly on the exposed oxide layer. If the wet oxide layer is maintained, to minimize defects, wafers transported from wet station 402 to CVD tool 404 can be kept in a substantially airtight enclosure to prevent possible environmental damage to the wet oxide layer before these wafers were loaded into the CVD chamber. After the first round of fabrication, photovoltaic structures emerging from CVD tool 404 can have a passivation layer and an emitter layer on one side (e.g., the p-side).

PVD tool 406 can be optional. It can be possible to print metal electrodes directly on the emitter layer. On the other hand, PVD tool 406 can be used to deposit a TCO layer on the emitter to enhance the energy conversion efficiency of the photovoltaic structures. In addition, high-efficiency photovoltaic structures often include electroplated Cu grids. To ensure good adhesion between electroplated Cu grids and the TCO layer, PVD tool 406 can also deposit one or more metallic layers on the TCO layer. Photovoltaic structures emerging from CVD tool 404 can be transported, sometimes via an automated conveyor system, to PVD tool 406 (as indicated by hollow arrow 410).

In some embodiments, PVD tool 406 can be configured to sequentially deposit the TCO layer and the one or more metallic layers, without breaking vacuum. For example, PVD tool 406 can include a multiple-target sputtering tool (e.g., an RF magnetron sputtering tool). The multiple targets inside the deposition chamber can include an ITO target and one or more metallic targets. In some embodiments, the targets can include rotary targets coupled to periodically tuned capacitors. After the first round of fabrication, photovoltaic structures emerging from PVD tool 406 can now have a complete photovoltaic layer stack (which can include the passivation layer, the emitter layer, the TCO layer, and the optional metallic layers) on one side (e.g., the p-side). In other words, fabrication steps on one side of the photovoltaic structures, except for metallization, are completed, and the photovoltaic structures are ready for fabrication steps on the other side (e.g., the n-side).

Upon the completion of the p-side fabrication, the semi-finished photovoltaic structures can be flipped over, with the p-side in contact with the automated conveyor system, and be transported back to wet station 402 (as indicated by hollow arrow 412) for the removal of the defects on the back side. At this stage, the p-side of the photovoltaic structures can be covered with heavily doped Si and/or TCO layer, and hence is not sensitive to environmental factors, such as moisture or physical contacts. At wet station 402, the photovoltaic structures can go through a QDR process to remove loose particles. The photovoltaic structures can further be submerged into a diluted HF solution to remove the sacrificial layer (e.g., the thin oxide layer) on the back side. After the QDR process and the diluted HF dip, the back side (e.g., the n-side) of the photovoltaic structures can be clean and defect free. Wet station 402 can optionally re-oxidize the back side of the photovoltaic structures. Photovoltaic structures emerging from wet station 402 for the second time can be dried (e.g., by using a warm $N_2$ blow dry process) and transported with one side (e.g., the p-side) down to CVD tool 404 (as indicated by hollow arrow 408) for the second time.

If the n-side of the photovoltaic structures has been re-oxidized, CVD tool 404 can simply deposit a surface field layer (e.g., an n-type doped Si layer) on the oxide layer. Otherwise, CVD tool 404 can sequentially deposit a passivation/tunneling layer (e.g., a thin oxide layer) and the surface field layer on the n-side of the photovoltaic structures. Photovoltaic structures emerging from CVD tool 404 for the second time can again be transported to PVD tool 406 (as indicated by hollow arrow 410) for the deposition of the n-side TCO layer and one or more metallic layers to complete the n-side layer stack. Subsequently, the photovoltaic structures can be sent to a plating tool (as indicated by hollow arrow 414). The plating tool (not shown in FIG. 4A) can deposit a metallic grid on each side of the photovoltaic structure. Optionally, before being sent to the plating tool, the photovoltaic structures can go through a rapid annealing process at a temperature greater than 200° C. to anneal both the TCO and the one or more metallic layers.

Figure 4B:
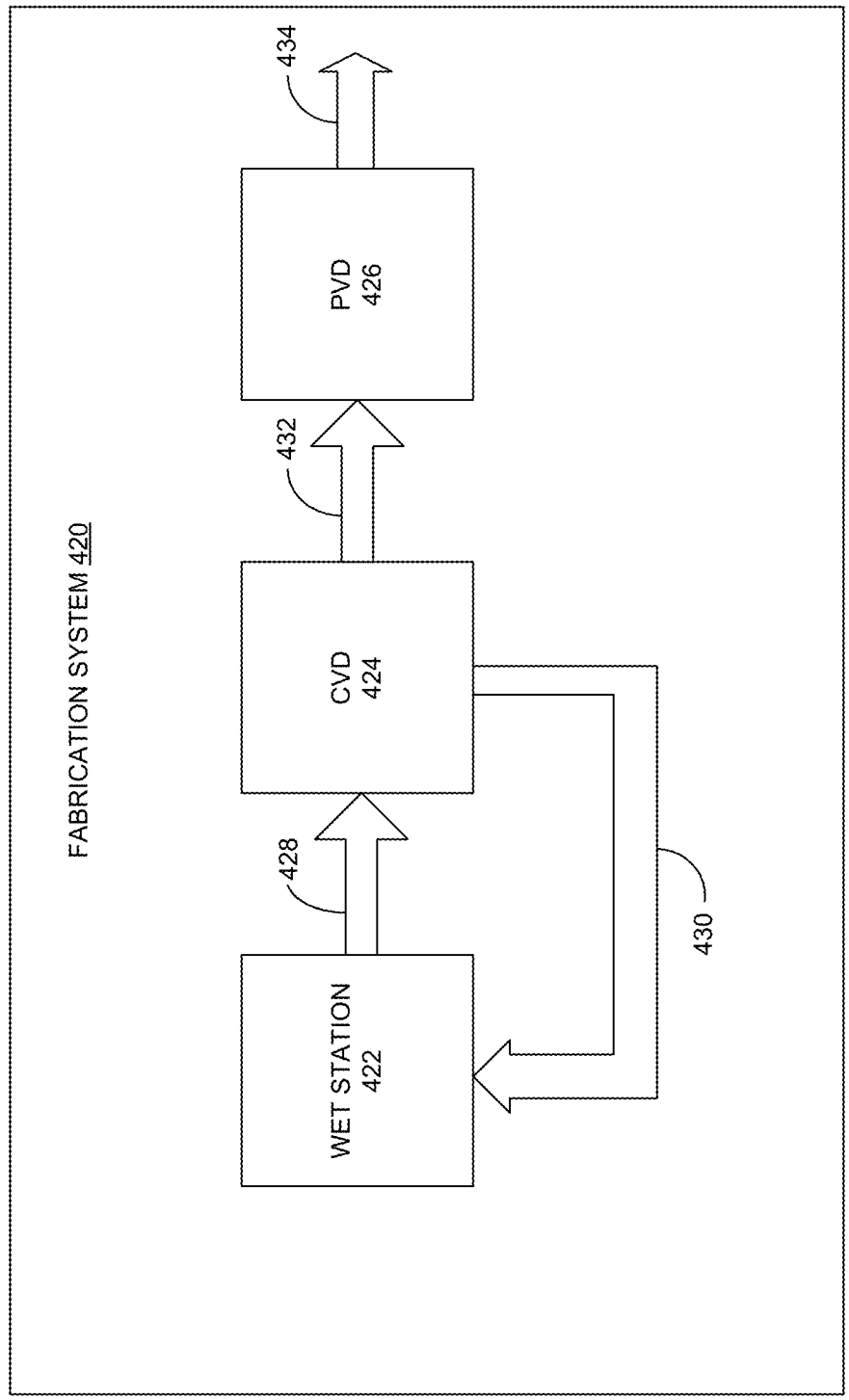
FIG. 4B shows an exemplary fabrication system, according to an embodiment of the present invention.

Variations to the fabrication system shown in FIG. 4A are also possible. FIG. 4B shows an exemplary fabrication system, according to an embodiment of the present invention. In FIG. 4B, fabrication system 420 can include wet station 422 and CVD tool 424, which are similar to wet station 402 and CVD tool 404 shown in FIG. 4A, respectively.

In FIG. 4B, Si wafers emerging from wet station 422 can be sent to CVD tool 424, as indicated by hollow arrow 428. Like CVD tool 404, CVD tool 424 can deposit a passivation layer and an emitter layer on one side of the Si wafers, forming the p-side stack. However, unlike what's shown in FIG. 4A, in FIG. 4B, after the deposition of the emitter layer, the Si wafers are sent, with the emitter layer facing down, back to wet station 422, as indicated by hollow arrow 430. Because the emitter layer surface is heavily doped, moisture or physical contact typically does not cause damage.

After the QDR process and the diluted HF dip at wet station 422, Si wafers with a clean back surface can be sent to CVD tool 424 for the second time, as indicated by hollow arrow 428. CVD tool 424 can deposit a passivation layer and a surface field layer on the back surface of the Si wafers to complete the n-side stack.

Si wafers with both the p-side stack and the n-side stack can then be transported to PVD tool 426 (as indicated by hollow arrow 432) for the deposition of the TCO layers and/or the metallic layers. Because both sides of the Si wafers are protected with heavily doped layers, it doesn't matter which side of the Si wafers are now in contact with the conveyor. PVD tool 426 can be configured to deposit the TCO and/or metallic layers on one side of the Si wafers at a time or it can be configured to deposit TCO and/or metallic layers simultaneously on both sides of the Si wafers. In the latter case, specially designed substrate holders that can be substantially vertically oriented may be needed to hold the Si wafers.

Similar to what's shown in FIG. 4A, in FIG. 4B, after the PVD process, Si wafers can be sent to the plating tool for metallization, as indicated by hollow arrow 434.

Figure 4C:
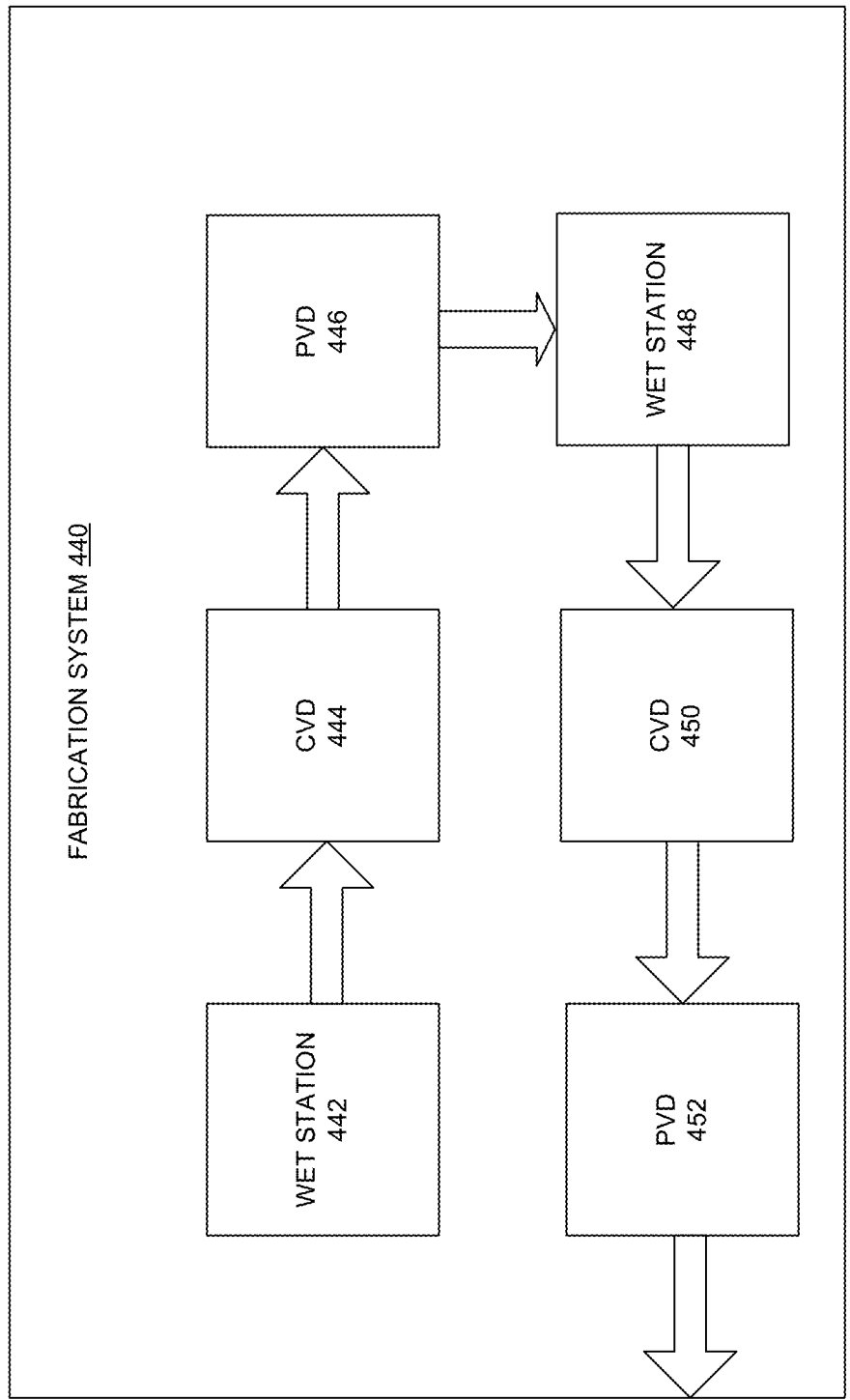
FIG. 4C shows an exemplary fabrication system, according to an embodiment of the present invention.

In the examples shown in FIGS. 4A-4B, material deposition on both sides of the photovoltaic structures can be performed by the same CVD and/or PVD machines. In a large manufacturing facility where multiple wet stations, CVD tools, and PVD tools are implemented, it can also be possible to arrange the multiple processing tools in an inline fashion. FIG. 4C shows an exemplary fabrication system, according to an embodiment of the present invention.

In FIG. 4C, fabrication system 440 can include wet stations 442 and 448, CVD tools 444 and 450, and PVD tools 446 and 452. During fabrication, n-type doped Si wafers can go through wet station 442 for surface treatment (including cleaning, texturing, and wet oxidation), CVD tool 444 for growing the p-side passivation layer and the p-type doped emitter layer, and PVD tool 446 for the deposition of the p-side TCO layer and/or metallic layers. Subsequently, the Si wafers can be sent to wet station 448 for the QDR and the removal of the sacrificial layer, CVD tool 450 for growing the n-side passivation layer and the n-type doped surface field layer, and PVD tool 452 for the deposition of the n-side TCO layer and/or metallic layers. This way, each individual tool does not need to change its settings between batches, because each tool only performs fabrications on one side of the photovoltaic structures.

In the examples shown in FIGS. 2-4C, the Si substrates can be n-type doped, and the p-side layer stack can be formed before the formation of the n-side layer stack. In practice, the substrates can be doped with either n-type dopants or p-type dopants, and the system can be configured to form either the n-side layer stack first or the p-side layer stack first. For example, the Si substrates can be n-type doped, and the system can first form the n-side layer stack (which can include the n-type doped surface field layer), and then form the p-side layer stack (which can include the p-type doped emitter layer). Alternatively, the Si substrates can be p-type doped, and the system can form the n-side layer stack (which can include the n-type doped emitter layer) first, and then form the p-side layer stack (which can include the p-type doped surface field layer).

Moreover, in the example shown in FIGS. 2-4C, the sacrificial layer on the back side can include a thin oxide layer. In practice, the sacrificial layer can include different materials. For example, the sacrificial layer can include intrinsic or doped Si. Depending on the type of material used for the sacrificial layer, the etchant used for removing the sacrificial layer may be different.

In general, compared with conventional fabrication methods for double-junction photovoltaic structures, the approaches provided by embodiments of the present invention include simple cleaning (e.g., QDR) and etching (e.g., removing the sacrificial layer) operations. These additional operations do not require complicated equipment setup, and can be compatible with most existing large-scale fabrication systems. In addition, they can provide significant improvement in performance and yield of the fabricated photovoltaic structures.

Figure 5A:
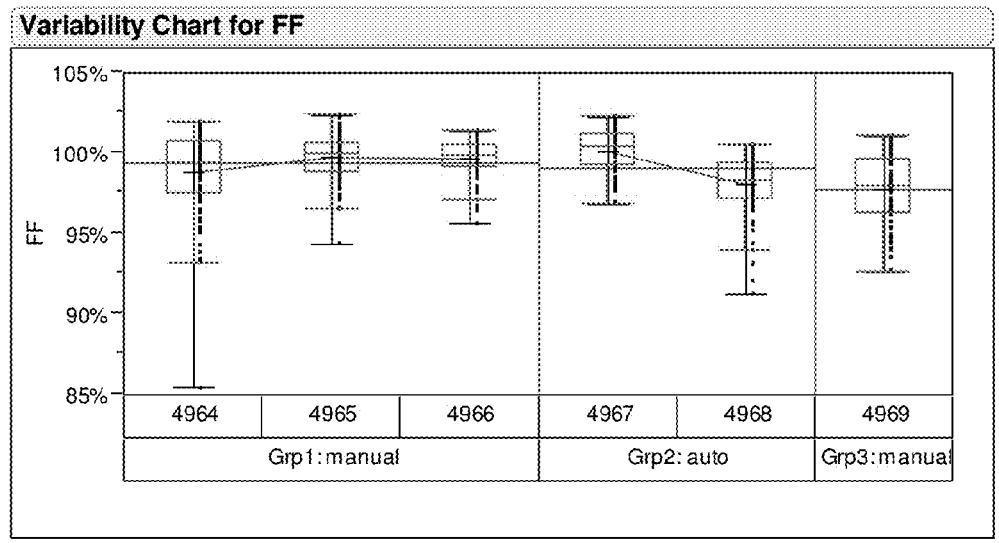
FIG. 5A shows comparisons of fill factors of photovoltaic structures fabricated using different processes.

FIG. 5A shows comparisons of fill factors of photovoltaic structures fabricated using different processes. In FIG. 5A, different batches of photovoltaic structures are divided into three groups. The first group is fabricated using a manual process, meaning that Si wafers are manually transferred between fabrication stations and there is no physical contact between the wafer surface and a conveyor system. The second group is fabricated using an automated process, meaning that Si wafers are transferred using a conveyor system and there is physical contact between the wafer surface and the conveyor system. When fabricating the second group, the fabrication process can include the QDR process and the removal of the sacrificial layer. The third group is fabricated using a manual process again. As one can see from FIG. 5A, there is no significant difference in performance between the manually fabricated photovoltaic structures and the photovoltaic structures fabricated using the automated system. Compared with the top chart shown in FIG. 1B, one can see a significant enhancement (over 5%) in the normalized fill factor. In other words, by implementing the QDR process and the sacrificial layer removal process, the fabrication system can reduce the negative impacts to the performance of the fabricated devices resulting from the automation.

Figure 5B:
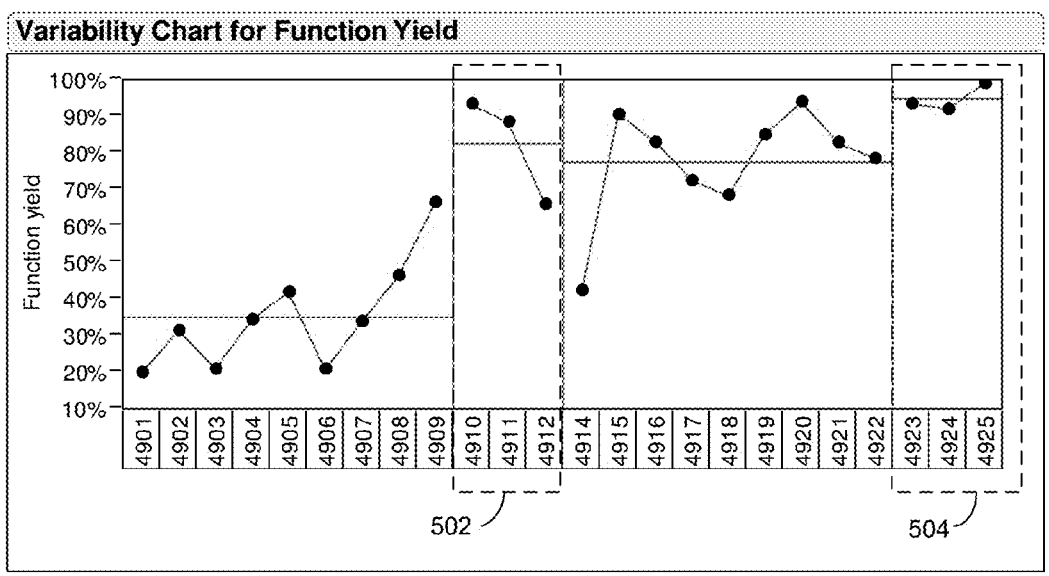
FIG. 5B shows comparisons of yields of photovoltaic structures fabricated using different processes.

FIG. 5B shows comparisons of yields for photovoltaic structures fabricated using different processes. In FIG. 5B, data points shown in dashed rectangles 502 and 504 are for photovoltaic structure batches fabricated using a process according to an embodiment of the present invention. Other data points are for photovoltaic structure batches fabricated using conventional processes (e.g., a process without the QDR and the sacrificial layer removal). As one can see from FIG. 5B, the fabrication process according to an embodiment of the present invention can provide significantly higher yields (above 90%) than conventional processes. Moreover, the embodiment of the present invention can also provide smaller variation in yield among batches than that of the conventional processes.

The foregoing descriptions of various embodiments have been presented only for purposes of illustration and description. They are not intended to be exhaustive or to limit the invention to the forms disclosed. Accordingly, many modifications and variations will be apparent to practitioners skilled in the art. Additionally, the above disclosure is not intended to limit the invention.

What is claimed is:

1. A method for fabricating a photovoltaic structure, comprising:
    forming a sacrificial layer on a first side of a Si substrate;

loading the Si substrate into a chemical vapor deposition tool, with the sacrificial layer in contact with a wafer carrier;

forming a first doped Si layer on a second side of the Si substrate;

subsequent to forming the first doped Si layer, removing the sacrificial layer that has been in contact with the wafer carrier;

loading the Si substrate into the chemical vapor deposition tool; and forming a second doped Si layer on the first side of the Si substrate.

2. The method of claim 1, wherein forming the sacrificial layer involves one or more operations selected from a group consisting of:

wet oxidation to form an oxide layer;
thermal oxidation to form an oxide layer;
low-pressure radical oxidation to form an oxide layer;
atomic layer deposition to form an oxide layer or a semiconductor layer; and
chemical-vapor deposition to form an oxide layer or a semiconductor layer.

3. The method of claim 1, wherein a thickness of the sacrificial layer is between 1 and 50 angstroms.

4. The method of claim 1, further comprising:
performing a quick dump rinsing operation prior to removing the sacrificial layer.

5. The method of claim 1, wherein the sacrificial layer includes an oxide layer, and wherein removing the sacrificial layer involves performing a diluted hydrofluoric acid dip.

6. The method of claim 5, wherein a concentration of the diluted hydrofluoric acid is between 0.1 and 5%.

7. The method of claim 1, further comprising:
forming a passivation layer positioned between the Si substrate and the first doped Si layer, wherein the passivation layer includes one or more materials selected from a group consisting of:
aluminum oxide;
amorphous Si;
amorphous SiC; and
intrinsic hydrogenated amorphous Si incorporated with oxygen.

8. The method of claim 1, further comprising:
forming a passivation layer positioned between the Si substrate and the second doped Si layer, wherein the passivation layer includes one or more materials selected from a group consisting of:
aluminum oxide;
amorphous Si;
amorphous SiC; and
intrinsic hydrogenated amorphous Si incorporated with oxygen.

9. The method of claim 1, wherein the first doped Si layer has a graded doping profile, and wherein a doping concentration of the first doped Si layer near a surface away from the Si substrate is greater than $3 \times 10^{19}/cm^3$.

10. The method of claim 1, further comprising one or more operations selected from a group consisting of:
forming a transparent conductive oxide layer on the first doped Si layer; and
forming a transparent conductive oxide layer on the second doped Si layer.

11. A fabrication system, comprising:
a first wet station configured to form a sacrificial layer on a first side of a plurality of photovoltaic structures;
a first chemical vapor deposition tool configured to deposit a first doped Si layer on a second side of the photovoltaic structures, wherein a wafer carrier associated with the first vapor deposition tool is in contact with the sacrificial layer;
a second wet station configured to remove the sacrificial layer; and
a second chemical vapor deposition tool configured to deposit a second doped Si layer on the first side of the photovoltaic structures, wherein during deposition, a wafer carrier associated with the second vapor deposition tool is facing the first doped Si layer.

12. The system of claim 11, wherein while forming the sacrificial layer, the first wet station is configured to perform a wet oxidation process to form an oxide layer on the first side of the photovoltaic structures.

13. The system of claim 12, wherein while removing the sacrificial layer, the second wet station is configured to perform a diluted hydrofluoric acid dip.

14. The system of claim 13, wherein a concentration of the diluted hydrofluoric acid is between 0.1 and 5%.

15. The system of claim 11, wherein a thickness of the sacrificial layer is between 1 and 50 angstroms.

16. The system of claim 11, wherein the second wet station is further configured to perform a quick dump rinsing operation prior to removing the sacrificial layer.

17. The system of claim 11, wherein the first chemical vapor deposition tool is further configured to form a passivation layer positioned between the Si substrate and the first doped Si layer, wherein the passivation layer includes one or more materials selected from a group consisting of:
aluminum oxide;
amorphous Si;
amorphous SiC; and
intrinsic hydrogenated amorphous Si incorporated with oxygen.

18. The system of claim 11, wherein the second chemical vapor deposition tool is further configured to form a passivation layer positioned between the Si substrate and the second doped Si layer, wherein the passivation layer includes one or more materials selected from a group consisting of:
aluminum oxide;
amorphous Si;
amorphous SiC; and
intrinsic hydrogenated amorphous Si incorporated with oxygen.

19. The system of claim 11, wherein the first doped Si layer has a graded doping profile, and wherein a doping concentration of the first doped Si layer near a surface away from the Si substrate is greater than $3 \times 10^{19}/cm^3$.

20. The system of claim 11, further comprising a physical vapor deposition tool configured to perform one or more operations selected from a group consisting of:
forming a transparent conductive oxide layer on the first doped Si layer; and
forming a transparent conductive oxide layer on the second doped Si layer.

* * * * *